(12) United States Patent
Bang et al.

(10) Patent No.: US 11,157,118 B2
(45) Date of Patent: Oct. 26, 2021

(54) ELECTRONIC PANEL AND ELECTRONIC APPARATUS HAVING THE SAME

(71) Applicant: Samsung Display Co., Ltd., Yongin-si (KR)

(72) Inventors: Gyeongnam Bang, Seoul (KR); Wonkyu Kwak, Seongnam-si (KR); Dongjin Moon, Cheonan-si (KR); Chung Yi, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/906,608

(22) Filed: Jun. 19, 2020

(65) Prior Publication Data

US 2020/0401273 A1 Dec. 24, 2020

(30) Foreign Application Priority Data

Jun. 21, 2019 (KR) .......................... 10-2019-0074367

(51) Int. Cl.
*G06F 3/044* (2006.01)
*H01L 27/32* (2006.01)
(Continued)

(52) U.S. Cl.
CPC .......... *G06F 3/0443* (2019.05); *H01L 27/323* (2013.01); *H01L 27/3223* (2013.01);
(Continued)

(58) Field of Classification Search
CPC ............. H01L 27/3223; H01L 51/0096; H01L 27/3244; H01L 51/5253; H01L 27/3276;
(Continued)

(56) References Cited

U.S. PATENT DOCUMENTS 10,078,976 B2 * 9/2018 Nam ..................... H01L 27/124
10,096,667 B2 10/2018 Park
(Continued)

FOREIGN PATENT DOCUMENTS

KR 10-1998-0011998 4/1998
KR 10-2017-0111827 10/2017
KR 10-2018-0049296 5/2018

OTHER PUBLICATIONS

Examination Report dated Nov. 11, 2020 issued in the European Patent Application No. 20181216.1.

*Primary Examiner* — Vinh T Lam
(74) *Attorney, Agent, or Firm* — H.C. Park & Associates, PLC

(57) ABSTRACT

An electronic panel including a base substrate, a display unit including pixels and an encapsulation layer, a sensing unit including first and second conductive patterns disposed on different layers with a sensing insulating layer therebetween, a planarization portion disposed between the display unit and the sensing unit and including a flat surface, an inclined surface, and a recess portion, and a crack sensing portion spaced apart from the first and second conductive patterns and including a crack sensing pattern overlapping with the planarization portion, a first connection line connected to one end of the crack sensing pattern and extending in a first direction, and a second connection line connected to the other end of the crack sensing pattern, spaced apart from the first connection line, and extending in the first direction, in which at least one of the first and second connection lines overlaps with the recess portion.

20 Claims, 27 Drawing Sheets

(51) Int. Cl.
*H01L 51/00* (2006.01)
*H01L 51/52* (2006.01)

(52) U.S. Cl.
CPC ...... *H01L 27/3244* (2013.01); *H01L 51/0096* (2013.01); *H01L 51/5253* (2013.01)

(58) Field of Classification Search
CPC ............... H01L 27/323; H01L 51/0031; H01L 27/3288; G06F 3/0443; Y02E 10/549
See application file for complete search history.

(56) References Cited

U.S. PATENT DOCUMENTS

| | | | | |
|---|---|---|---|---|
| 10,319,750 | B2* | 6/2019 | Park | G02F 1/1309 |
| 10,861,361 | B2* | 12/2020 | Kim | G09G 3/3266 |
| 10,886,346 | B2* | 1/2021 | Kim | H01L 27/1218 |
| 10,997,881 | B2* | 5/2021 | Shin | G09G 3/006 |
| 2016/0079539 | A1* | 3/2016 | Kim | H01L 51/0097 |
| | | | | 257/40 |
| 2016/0111478 | A1* | 4/2016 | Hong | H01L 51/5246 |
| | | | | 257/40 |
| 2016/0293884 | A1* | 10/2016 | Zhang | H05B 45/60 |
| 2016/0307931 | A1* | 10/2016 | Hong | H01L 27/1222 |
| 2016/0307971 | A1* | 10/2016 | Jeon | H01L 51/5246 |
| 2016/0322451 | A1* | 11/2016 | Park | G09G 3/006 |
| 2016/0351093 | A1* | 12/2016 | Kim | G09G 3/2092 |
| 2017/0263880 | A1* | 9/2017 | Lee | H01L 27/3244 |
| 2017/0287992 | A1 | 10/2017 | Kwak et al. | |
| 2017/0330917 | A1* | 11/2017 | Kim | H01L 27/323 |
| 2018/0033355 | A1* | 2/2018 | Lee | H01L 27/3223 |
| 2018/0158894 | A1* | 6/2018 | Park | H01L 51/5253 |
| 2018/0166525 | A1* | 6/2018 | Kim | H01L 51/5253 |
| 2018/0174505 | A1* | 6/2018 | Mandlik | G09G 3/3677 |
| 2018/0218658 | A1 | 8/2018 | Kim et al. | |
| 2018/0308903 | A1* | 10/2018 | Jeong | H01L 27/3276 |
| 2019/0157607 | A1* | 5/2019 | Kim | H01L 27/3246 |
| 2019/0165312 | A1* | 5/2019 | Bae | H01L 51/5246 |
| 2019/0213935 | A1* | 7/2019 | Jung | G09G 3/006 |
| 2020/0066196 | A1* | 2/2020 | Hao | G01N 27/00 |

* cited by examiner

ELECTRONIC PANEL AND ELECTRONIC APPARATUS HAVING THE SAME

CROSS-REFERENCE TO RELATED APPLICATION

This application claims priority from and the benefit of Korean Patent Application No. 10-2019-0074367, filed on Jun. 21, 2019, which is hereby incorporated by reference for all purposes as if fully set forth herein.

BACKGROUND

Field

Exemplary embodiments of the invention relate generally to an electronic apparatus and, more specifically to an electronic apparatus having a through-hole defined therethrough and sensing an external input.

Discussion of the Background

An electronic apparatus is activated in response to electrical signals applied thereto. The electronic apparatus includes devices of various electronic components, such as an electronic panel and an electronic module. The electronic panel includes a display unit that displays an image or a sensing unit that senses an external input. The electronic components are electrically connected to each other by signal lines arranged in various ways.

The display unit includes a light emitting device that generates an image. The sensing unit includes sensing electrodes to sense an external input. The sensing electrodes are arranged in an active area. The sensing unit is generally designed to have uniform sensitivity across the active area.

The above information disclosed in this Background section is only for understanding of the background of the inventive concepts, and, therefore, it may contain information that does not constitute prior art.

SUMMARY

Electronic apparatus constructed according to exemplary embodiments of the invention have an improved reliability.

Additional features of the inventive concepts will be set forth in the description which follows, and in part will be apparent from the description, or may be learned by practice of the inventive concepts.

An electronic panel according to an exemplary embodiment includes a base substrate, a display unit disposed on the base substrate and including a plurality of pixels and an encapsulation layer covering the pixels, a sensing unit disposed on the display unit and including a sensing insulating layer, a first conductive pattern, and a second conductive pattern, the first and second conductive patterns being disposed on different layers from each other with the sensing insulating layer interposed therebetween, a planarization portion disposed between the display unit and the sensing unit, and including a flat surface, an inclined surface inclined at a predetermined inclination angle from the flat surface, and a recess portion recessed from the flat surface and the inclined surface, and a crack sensing portion disposed on the sensing insulating layer, spaced apart from the first and second conductive patterns, and including a crack sensing pattern overlapping with the planarization portion, a first connection line connected to one end of the crack sensing pattern and extending in a first direction, and a second connection line connected to the other end of the crack sensing pattern, spaced apart from the first connection line, and extending in the first direction, in which at least one of the first connection line and the second connection line overlaps with the recess portion.

A thickness of the recess portion measured from an imaginary surface extending from the flat surface may increase along the first direction.

A width of the recess portion in a direction perpendicular to the first direction may increase in a direction toward an upper end, at which the flat surface contacts the inclined surface.

The recess portion may have a polygonal shape when viewed in a plan view.

The recess portion may have a semicircular shape in an area overlapping with the inclined surface when viewed in a plan view.

The inclination angle may be equal to or less than about 90 degrees.

At least a portion of the planarization portion may contact the encapsulation layer.

The electronic panel may further include a module hole defined through the display unit, the sensing unit, and the planarization portion, in which the planarization portion may surround an edge of the module hole.

The crack sensing pattern may have an open-curve shape that surrounds at least a portion of the module hole.

The base substrate may further include a groove recessed from a portion of an upper surface of the base substrate and having a closed-line shape.

At least one of the first connection line and the second connection line may be covered by the sensing insulating layer.

At least one of the first and second connection lines covered by the sensing insulating layer may be connected to the crack sensing pattern via a contact hole defined through the sensing insulating layer.

The sensing unit may include a first sensing electrode including a first sensing pattern, and a first connection pattern disposed on a different layer from the first sensing pattern and connected to the first sensing pattern after penetrating through the sensing insulating layer, a second sensing electrode including a second sensing pattern disposed on the same layer as the first sensing pattern while being spaced apart therefrom, and a second connection pattern connected to the second sensing pattern, and a dummy pattern portion including floating patterns disposed on the same layer as the first sensing pattern, spaced apart from the first sensing pattern and the second sensing pattern, and connected to each of the first connection line and the second connection line, in which the first conductive pattern may include the first connection pattern, and the second conductive pattern may include the first sensing pattern, the second sensing pattern, the second connection pattern, and the dummy pattern portion.

The crack sensing portion may include crack sensing lines disposed on the sensing insulating layer and spaced apart from the first sensing electrode and the second sensing electrode, and each of the floating patterns may be connected to a corresponding crack sensing line among the crack sensing lines.

An electronic apparatus according to another exemplary embodiment includes an electronic panel having a front surface and a rear surface facing the front surface, and including a module hole defined through the front surface and the rear surface, and an electronic module overlapping with the module hole, the electronic panel including a base substrate having an active area and a peripheral area adjacent to the active area, the active area including a hole area overlapping with the module hole, a display unit disposed on the base substrate and including a plurality of pixels arranged in the active area and an encapsulation layer covering the pixels, a sensing unit disposed on the display unit and including a sensing insulating layer, a first conductive pattern, and a second conductive pattern, the first and second conductive patterns being disposed on different layers from each other with the sensing insulating layer interposed therebetween, a planarization portion disposed in the hole area between the display unit and the sensing unit, and including a flat surface, an inclined surface inclined at a predetermined inclination angle from the flat surface, and a recess portion recessed from the flat surface and the inclined surface, and a crack sensing portion including a crack sensing pattern disposed in the hole area to surround at least a portion of the module hole and overlapping with the planarization portion, a first connection line connected to one end of the crack sensing pattern and overlapping with the hole area and a portion of the active area, and a second connection line connected to the other end of the crack sensing pattern, spaced apart from the first connection line, and overlapping with the hole area and a portion of the active area, in which at least one of the first connection line and the second connection line overlaps with the recess portion.

A thickness of the recess portion measured from an imaginary surface extending from the flat surface may increase along a first direction to which the first connection line extends.

A width of the recess portion in a second direction perpendicular to first direction may increase along the first direction.

The recess portion may have a polygonal shape when viewed in a plan view.

A portion of the recess portion overlapping with the inclined surface may have a V-shape or a U-shape when viewed in a plan view.

The crack sensing pattern may have an open-curve shape, and the module hole may be defined inside the open-curve of the crack sensing pattern to penetrate through each of the display unit, the sensing unit, and the planarization portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
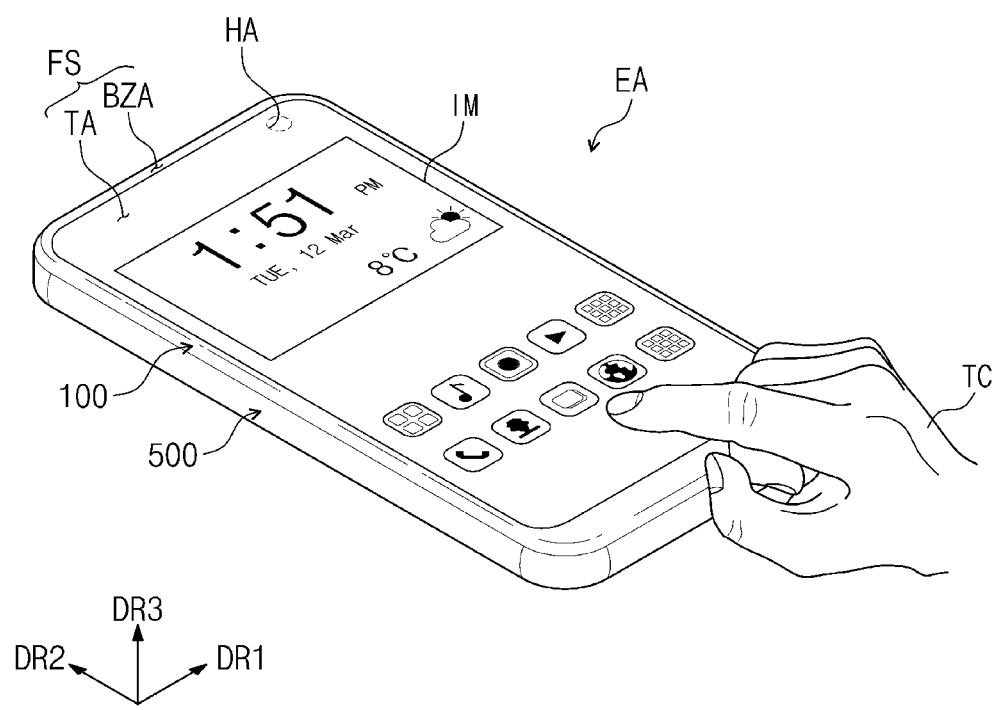
FIG. 1A is a perspective view of an electronic apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
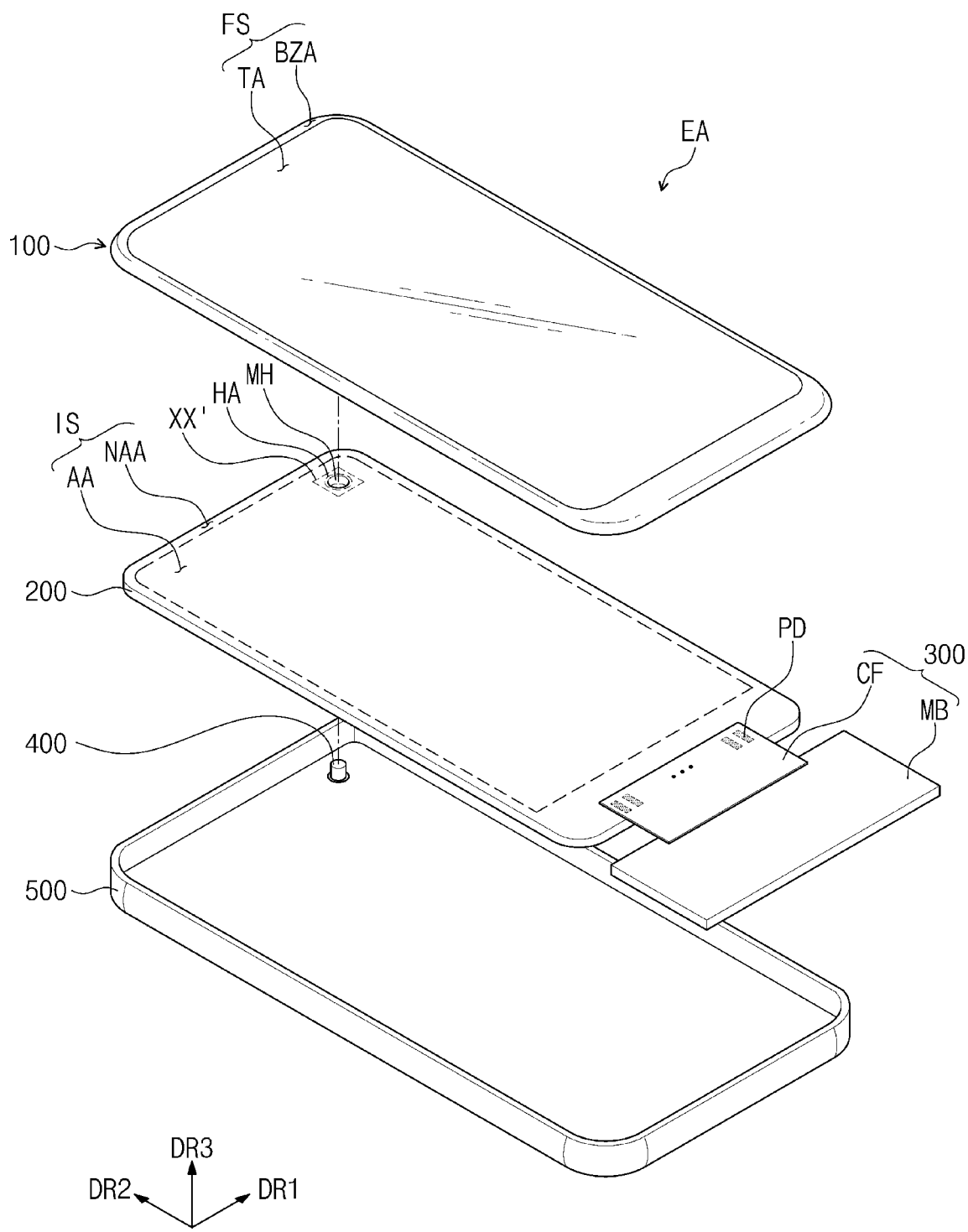
FIG. 1B is an exploded perspective view of the electronic apparatus of FIG. 1A.
Figure 2:
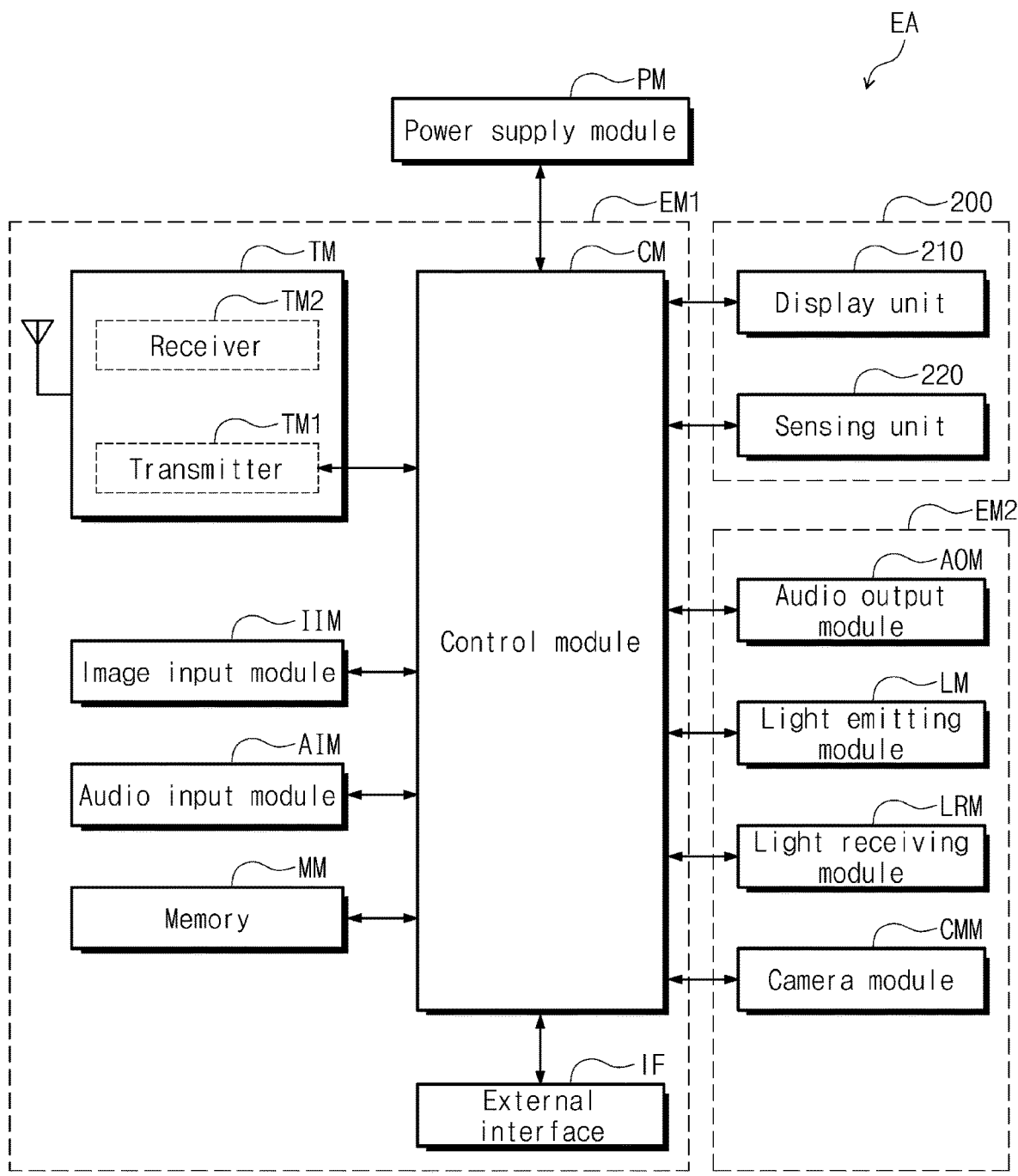
FIG. 2 is a block diagram of the electronic apparatus of FIG. 1A.

FIG. 1A is an assembled perspective view of an electronic apparatus EA according to an exemplary embodiment. FIG. 1B is an exploded perspective view of the electronic apparatus EA shown in FIG. 1A. FIG. 2 is a block diagram of the electronic apparatus EA shown in FIG. 1A.

The electronic apparatus EA may be an apparatus activated in response to electrical signals applied thereto. The electronic apparatus EA may be used in various technical fields. For example, the electronic apparatus EA may be a tablet computer, a notebook computer, a computer, or a smart television. In the illustrated exemplary embodiment, the electronic device EA will be described with reference to a smartphone.

Referring to FIGS. 1A and 1B, the electronic apparatus EA may display an image IM on a front surface FS thereof. The front surface FS may be substantially parallel to a surface defined by a first direction DR1 and a second direction DR2. The front surface FS includes a transmission area TA and a bezel area BZA adjacent to the transmission area TA.

The electronic apparatus EA displays the image IM through the transmission area TA. The image IM includes at least one of a still image and a motion image. FIG. 1A exemplarily shows a clock widget and application icons as the image IM.

The transmission area TA may have a quadrangular shape substantially parallel to each of the first direction DR1 and the second direction DR2. However, the inventive concepts are not limited thereto, and the transmission area TA may have various shapes in other exemplary embodiments.

The bezel area BZA is formed adjacent to the transmission area TA. The bezel area BZA may surround the transmission area TA. However, the inventive concepts are not limited thereto, and in some exemplary embodiments, the bezel area BZA may be formed adjacent to only one side of the transmission area TA or may be omitted.

A normal line direction of the front surface FS may correspond to a thickness direction DR3 (hereinafter, referred to as a "third direction") of the electronic apparatus EA. As used herein, front (or upper) and rear (or lower) surfaces of each member are defined with respect to a direction, in which the image IM is displayed. The front and rear surfaces are opposite to each other in the third direction DR3.

Directions indicated by the first, second, and third directions DR1, DR2, and DR3 are relative to each other, and the directions indicated by the first, second, and third directions DR1, DR2, and DR3 may be changed to other directions. Hereinafter, the first, second, and third direction axes are respectively indicated by the first, second, and third directions DR1, DR2, and DR3, and assigned with the same reference numerals.

The electronic apparatus EA may sense a user input TC applied thereto. The user input TC may include various types of external inputs, such as a portion of user's body, light, heat, or pressure. In addition, the electronic apparatus EA may sense a proximity input, as well as a touch input to the electronic apparatus EA.

In FIG. 1A, the user input TC is exemplarily shown as a user's hand applied to the front surface. As described above, however, the user input TC may be provided in various forms, and thus, in some exemplary embodiments, the electronic apparatus EA may sense the user input TC applied to a side or rear surface of the electronic apparatus EA depending on a structure of the electronic apparatus EA.

The electronic apparatus EA includes a window 100, an electronic panel 200, a circuit board 300, an electronic module 400, and an external case 500. The window 100 and the external case 500 are coupled to each other to define an appearance of the electronic apparatus EA.

The window 100 is disposed on the electronic panel 200 to cover a front surface IS of the electronic panel 200. The window 100 includes an optically transparent insulating material. For example, the window 100 includes glass or plastic. The window 100 has a single-layer or multi-layer structure. For example, the window 100 has a stacked structure of a plurality of plastic films attached to each other by an adhesive, or a stacked structure of a glass substrate and a plastic film, which are attached to each other by an adhesive.

The window 100 includes a front surface FS exposed to the outside. The front surface FS of the electronic apparatus EA may be defined by the front surface FS of the window 100.

In particular, the transmission area TA may be an optically transparent area. The transmission area TA may have a shape corresponding to an active area AA. For example, the transmission area TA may overlap with at least a portion or the entire surface of the active area AA. The image IM displayed through the active area AA of the electronic panel 200 may be viewed from the outside through the transmission area TA.

The bezel area BZA may be an area having a light transmittance relatively lower than that of the transmission area TA. The bezel area BZA may define a shape of the transmission area TA. The bezel area BZA may be disposed adjacent to the transmission area TA and may surround the transmission area TA.

The bezel area BZA may have a predetermined color. When the window 100 includes a glass or plastic substrate, the bezel area BZA may be a color layer printed on or deposited on one surface of the glass or plastic substrate. As another example, the bezel area BZA may be formed by coloring a corresponding area of the glass or plastic substrate.

The bezel area BZA may cover a peripheral area NAA of the electronic panel 200 to prevent the peripheral area NAA from being perceived from the outside. However, the inventive concepts are not limited thereto, and in some exemplary embodiments, the bezel area BZA may be omitted from the window 100.

The electronic panel 200 may display the image IM and may sense the external input TC. The electronic panel 200 may include the front surface IS, in which the active area AA and the peripheral area NAA are defined. The active area AA may be an area activated in response to electrical signals.

In the illustrated exemplary embodiment, the active area AA may be an area, in which the image IM is displayed and the external input TC is sensed. The transmission area TA may overlap with the active area AA of the window 100. For example, the transmission area TA may overlap with at least a portion or the entire surface of the active area AA. As such, the user may perceive the image IM through the transmission area TA, or may apply the external input TC through the transmission area TA. However, the inventive concepts are not limited thereto. In some exemplary embodiments, the area in which the image IM is displayed in the active area AA may be separated from the area in which the external input TC is sensed in the active area AA.

The peripheral area NAA may be covered by the bezel area BZA of the window 100. The peripheral area NAA may be disposed adjacent to the active area AA. The peripheral area NAA may surround the active area AA. A driving circuit or a driving line may be disposed in the peripheral area NAA to drive the active area AA.

Various signal lines, pads PD, or electronic devices may be arranged in the peripheral area NAA to apply electrical signals to the active area AA. The peripheral area NAA may be covered by the bezel area BZA, and thus, the peripheral area NAA may not be visible from the outside.

In the illustrated exemplary embodiment, the electronic panel 200 is assembled to be in a flat state, such that the active area AA and the peripheral area NAA face the window 100. However, the inventive concepts are not limited thereto, and in some exemplary embodiments, a portion of the peripheral area NAA of the electronic panel 200 may be bent. In this case, the portion of the peripheral area NAA may be bent toward the rear surface of the electronic apparatus EA, and the bezel area BZA may be reduced in the front surface of the electronic apparatus EA. As another example, the electronic panel 200 may be assembled to be in a state, in which a portion of the active area AA is bent. As another example, the peripheral area NAA may be omitted from the electronic panel 200.

Referring to FIG. 2, the electronic panel 200 may include a display unit 210 and a sensing unit 220. The display unit 210 may have a configuration that substantially generates the image IM. The image IM generated by the display unit 210 may be viewed from the outside to the user through the transmission area TA.

The sensing unit 220 may sense the external input TC applied thereto from the outside. As described above, the sensing unit 220 may sense the external input TC applied thereto through the window 100.

A predetermined hole area HA may be defined in the electronic panel 200. In the illustrated exemplary embodiment, the hole area HA may be included in the active area AA. Accordingly, the hole area HA may be disposed in the active area AA, and may be surrounded by the active area AA. The hole area HA may overlap with the electronic module 400 to be described later when viewed in a plan view. In the illustrated exemplary embodiment, the hole area HA is spaced apart from the peripheral area NAA.

The electronic panel 200 may include a module hole MH defined in the hole area HA and penetrating through the electronic panel 200. The module hole MH may penetrate at least one of the display unit 210 and the sensing unit 220. An edge of the hole area HA may be spaced apart from, and may surround an edge of the module hole MH. The edge of the hole area HA may have a shape corresponding to the module hole MH.

The circuit board 300 may be connected to the electronic panel 200. The circuit board 300 may include a flexible board CF and a main board MB. The flexible board CF may include an insulating film and conductive lines mounted on the insulating film. The conductive lines may be connected to the pads PD to electrically connect the circuit board 300 to the electronic panel 200.

In the illustrated exemplary embodiment, the flexible board CF may be assembled in the bent state. Accordingly, the main board MB may be disposed on the rear surface of the electronic panel 200, and may be stably accommodated in a space defined by the external case 500. In some exemplary embodiments, the flexible board CF may be omitted, and in this case, the main board MB may be directly connected to the electronic panel 200.

The main board MB may include signal lines and electronic devices connected to the signal lines to be electrically connected to the electronic panel 200. The electronic devices may generate various electrical signals, e.g., signals to generate the image IM or signals to sense the external input TC, or may process the sensed signals. In some exemplary embodiments, the main board MB may be provided in a plural number to respectively correspond to the electrical signals that are to be generated or processed, without being limited thereto.

According to an exemplary embodiment, a driving circuit that applies the electrical signals to the active area AA may be directly mounted on the electronic panel 200. In this case, the driving circuit may be mounted in the form of chip or may be formed together with pixels PX. In this manner, the circuit board 300 may be omitted or an area of the circuit board 300 may be reduced.

The electronic module 400 is disposed under the window 100. The electronic module 400 may overlap with the module hole MH when viewed in a plan view, and may overlap with the hole area HA. The electronic module 400 may receive the external input transmitted thereto via the hole area HA, or may provide an output via the hole area HA.

In the electronic module 400, a receiving portion that receives the external input or an output portion that provides the output may overlap with the hole area HA when viewed in a plan view. A portion or the entire portion of the electronic module 400 may be accommodated in the hole area HA or in the module hole MH. According to an exemplary embodiment, the electronic module 400 is disposed to overlap with the active area AA, and thus, the size of the bezel area BZA may not need to be increased.

Referring to FIG. 2, the electronic apparatus EA may include the electronic panel 200, a power supply module PM, a first electronic module EM1, and a second electronic module EM2. The electronic panel 200, the power supply module PM, the first electronic module EM1, and the second electronic module EM2 are electrically connected to each other. FIG. 2 exemplarily shows the display unit 210 and the sensing unit 220 among the components of the electronic panel 200.

The first electronic module EM1 and the second electronic module EM2 may include various functional modules to operate the electronic apparatus EA. The first electronic module EM1 may be directly mounted on a mother board electrically connected to the electronic panel 200, or may be electrically connected to the mother board through a connector after being mounted on a separate board.

The first electronic module EM1 may include a control module CM, a wireless communication module TM, an image input module IIM, an audio input module AIM, a memory MM, and an external interface IF. Some of the modules may be electrically connected to the mother board through a flexible printed circuit board without being mounted on the mother board.

The control module CM may control the overall operation of the electronic apparatus EA. According to an exemplary embodiment, the control module CM may be a microprocessor, without being limited thereto. For example, the control module CM may activate or deactivate the electronic panel 200. The control module CM may control other modules, e.g., the image input module IIM or the audio input module AIM, based on a touch signal provided from the electronic panel 200.

The wireless communication module TM may transmit/receive a wireless signal to/from another terminal by using a Bluetooth or Wi-Fi line. The wireless communication module TM may transmit/receive a voice signal by using a conventional communication line. The wireless communication module TM may include a transmitter TM1 that modulates a signal to be transmitted and transmits the modulated signal, and a receiver TM2 that demodulates the signal applied thereto.

The image input module IIM may process an image signal and convert the image signal into image data that may be displayed through the electronic panel 200. The audio input module AIM may receive an external audio signal through a microphone in a recording mode and a voice recognition mode, and converts the audio signal into electrical voice data.

The external interface IF may function as an interface between the control module CM and external devices, such as an external charger, a wired/wireless data port, and a card socket (e.g., a memory card and a SIM/UIM card).

The second electronic module EM2 may include an audio output module AOM, a light emitting module LM, a light receiving module LRM, and a camera module CMM. The components of the second electronic module EM2 may be directly mounted on the mother board, electrically connected to the electronic panel 200 through a connector after being mounted on a separate substrate, or electrically connected to the first electronic module EM1.

The audio output module AOM may convert and output the audio data provided from the wireless communication module TM or the audio data stored in the memory MM to the outside.

The light emitting module LM may generate and emit light. The light emitting module LM may emit an infrared light, for example. The light emitting module LM may include a light emitting diode (LED) device. The light receiving module LRM may sense the infrared light. The light receiving module LRM may be activated when sensing the infrared light equal to or greater than a predetermined level. The light receiving module LRM may include a complementary metal oxide semiconductor (CMOS) sensor. The infrared light generated by the light emitting module LM may be incident into the light receiving module LRM after being output from the light emitting module LM and reflected by an external object, e.g., a user's finger or face. The camera module CMM may photograph an external image.

The electronic module 400 according to an exemplary embodiment may include at least one of the components of the first electronic module EM1 and the second electronic module EM2. For example, the electronic module 400 may include at least one of a camera, a speaker, a light sensing sensor, and a heat sensing sensor. The electronic module 400 may sense an external objected through the hole area HA or may provide a sound signal, such as a voice, to the outside through the hole area HA. In addition, the electronic module 400 may include a plurality of components, without being limited to the illustrated exemplary embodiment.

The electronic module 400 disposed to overlap with the hole area HA may easily recognize the external object via the hole area HA, or the output signal generated by the electronic module 400 may be easily transmitted to the outside. In some exemplary embodiments, the electronic apparatus EA may further include a transparent member disposed between the electronic module 400 and the electronic panel 200. The transparent member may be optically transparent film, so that the external input transmitted through the module hole MH is transmitted to the electronic module 400 after passing through the transparent member.

The transparent member may be attached to the rear surface of the electronic panel 200, or may be disposed between the electronic panel 200 and the electronic module 400 without a separate adhesive.

According to an exemplary embodiment, the electronic module 400 may be assembled to overlap with the transmission area TA when viewed in a plan view. Accordingly, the size of the bezel area BZA may not need to be increased to accommodate the electronic module 400, and thus, an aesthetic design of the electronic apparatus EA may be improved.

Figure 3A:
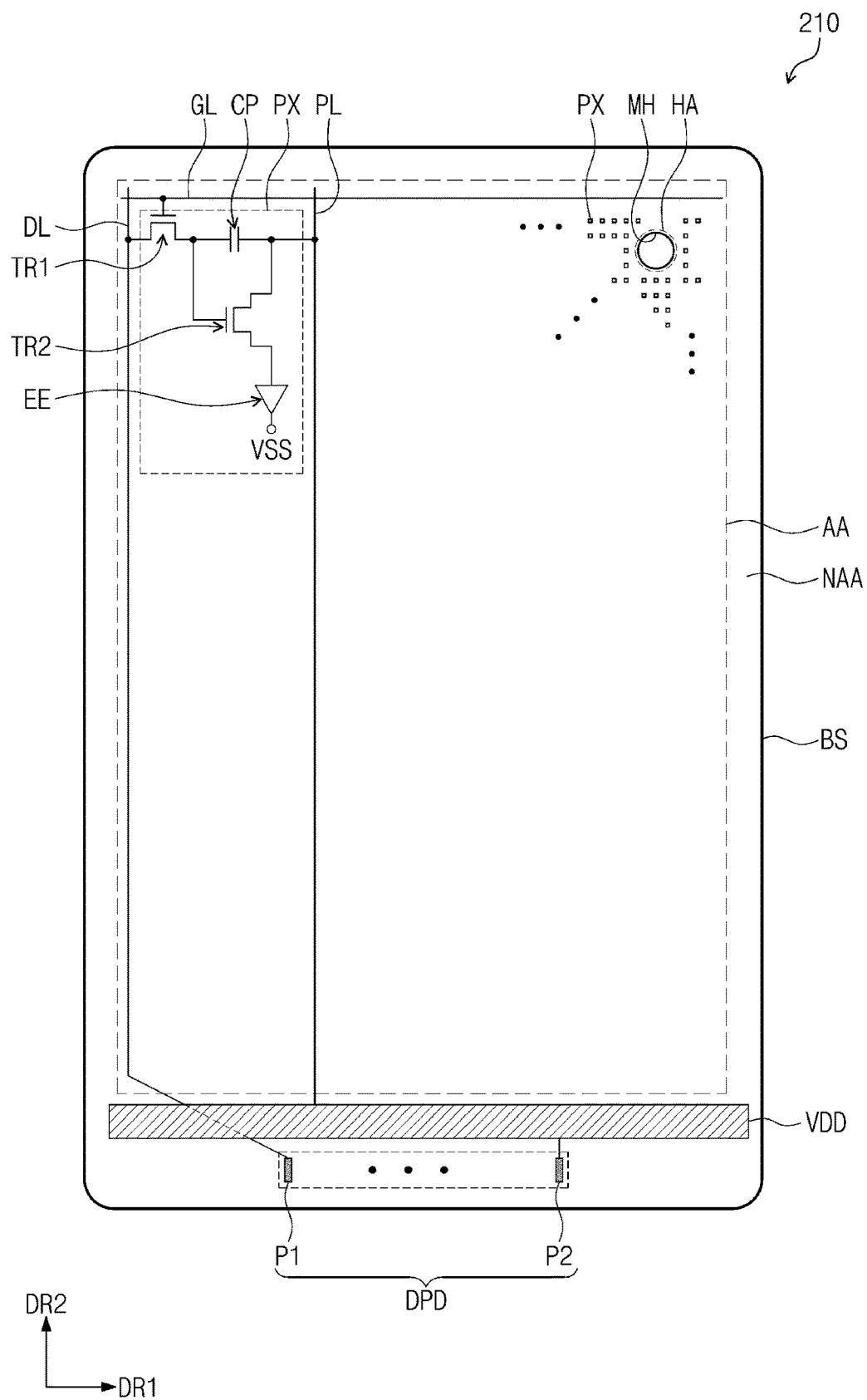
FIG. 3A is a plan view of a display unit according to an exemplary embodiment.
Figure 3B:
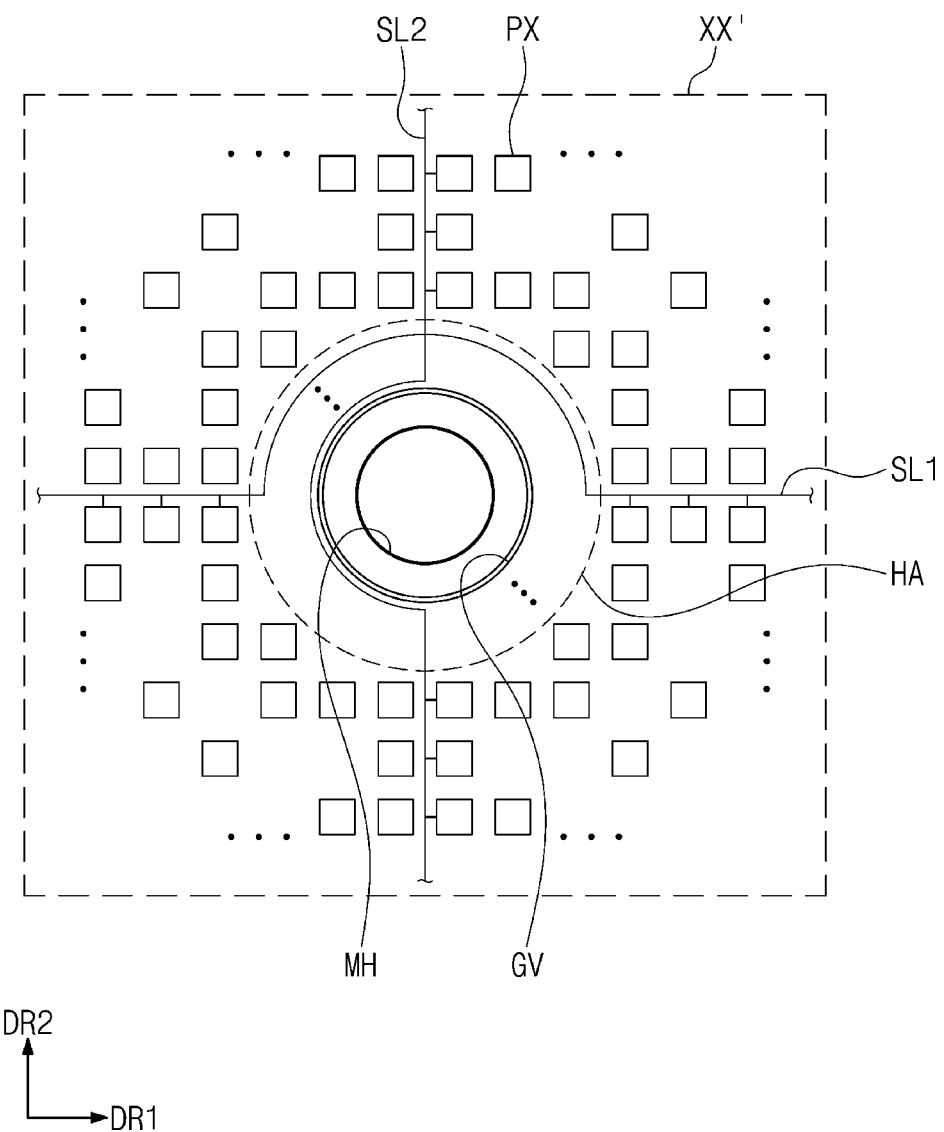
FIG. 3B is an enlarged view of a portion of the display unit of FIG. 3A.

FIG. 3A is a plan view of the display unit 210 according to an exemplary embodiment. FIG. 3B is an enlarged view of a portion of the display unit shown in FIG. 3A.

Referring to FIG. 3A, the display unit 210 may include a base substrate BS, a plurality of pixels PX, a plurality of signal lines GL, DL, and PL, and a plurality of display pads DPD. The active area AA and the peripheral area NAA may be defined by an area to which light emitted from the pixels PX is provided or not.

The base substrate BS may include an insulating substrate. For example, the base substrate BS may include a glass substrate, a plastic substrate, or a combination thereof.

The signal lines GL, DL, and PL may be connected to the pixels PX, and may transmit electrical signals to the pixels PX. Among the signal lines included in the display unit 210, a scan line GL, a data line DL, and a power line PL are exemplarily shown in FIG. 3A. However, the inventive concepts are not limited thereto. In some exemplary embodiments, the signal lines included in the display unit 210 may further include at least one of a power line, an initialization voltage line, and a light emitting control line.

The pixels PX may be arranged in the active area AA. In FIG. 3A, a signal circuit diagram of one pixel PX of the pixels is enlarged and exemplarily shown. The pixel PX may include a first thin film transistor TR1, a capacitor CP, a second thin film transistor TR2, and a light emitting element EE. The first thin film transistor TR1 may be a switching device that controls on and off of the pixel PX. The first thin film transistor TR1 may transmit or block a data signal applied thereto through the data line DL in response to a scan signal applied thereto through the scan line GL.

The capacitor CP may be connected to the first thin film transistor TR1 and the power line PL. The capacitor CP is charged with an amount of electric charges corresponding to a difference between the data signal provided from the first thin film transistor TR1 and a first power signal applied to the power line PL.

The second thin film transistor TR2 is connected to the first thin film transistor TR1, the capacitor CP, and the light emitting element EE. The second thin film transistor TR2 controls a driving current flowing through the light emitting element EE in response to the amount of the electric charges charged in the capacitor CP. A turn-on time of the second thin film transistor TR2 is determined depending on the amount of the electric charges charged in the capacitor CP. The second thin film transistor TR2 applies the first power signal applied thereto via the power line PL during the turn-on time to the light emitting element EE.

The light emitting element EE may emit light or may control the amount of light amount in response to an electrical signal. For example, the light emitting element EE may include an organic light emitting element, a quantum dot light emitting element, an electrophoretic element, or an electrowetting element.

The light emitting element EE may be connected to a power terminal VSS to receive a power signal (hereinafter, referred to as a "second power signal") different from the first power signal provided through the power line PL. In the light emitting element EE, the driving current corresponding to a difference between an electrical signal provided from the second thin film transistor TR2 and the second power signal may be applied, and the light emitting element EE may generate light corresponding to the driving current. However, the inventive concepts are not limited thereto, and in some exemplary embodiments, each pixel PX may include electronic devices having various configurations and arrangements.

The pixels PX may be arranged around the module hole MH, and may surround the module hole MH. In FIG. 3B, the hole area HA is shown by a dotted line. An area XX' includes an area in which the module hole MH is defined. Hereinafter, a portion of the display unit 210, in which the module hole MH is defined, will be described in more detail with reference to FIG. 3B.

As described above, the module hole MH may be defined in the active area AA. As such, at least a portion of the pixels PX may be disposed adjacent to the module hole MH. Some pixels among the pixels PX may surround the module hole MH.

A predetermined groove GV may be defined in the hole area HA. The groove GV is disposed along an edge of the module hole MH when viewed in a plan view. The groove GV according to the illustrated exemplary embodiment has a closed-line shape to surround the module hole MH. However, the inventive concepts are not limited thereto. In some exemplary embodiments, the groove GV may have a shape different from the module hole MH, and may have a closed-line shape including a polygonal shape, an elliptical shape, or at least a curved portion, or may have a plurality of patterns partially disconnected.

The groove GV may be formed by being recessed from an upper surface of the base substrate BS. The groove GV blocks a path, through which moisture or oxygen introduced from the outside through the module hole MH infiltrates into the display unit 210, which will be described in more detail later.

A plurality of signal lines SL1 and SL2 connected to the pixels PX may be disposed in the hole area HA. The signal lines SL1 and SL2 are connected to the pixels PX via the hole area HA. FIG. 3B exemplarily shows a first signal line SL1 and a second signal line SL2 among the signal lines connected to the pixels PX.

The first signal line SL1 extends in the first direction DR1. The first signal line SL1 is connected to pixels arranged in the same row along the first direction DR1 among the pixels PX. The first signal line SL1 will be described as corresponding to a scan line GL.

Some pixels among the pixels connected to the first signal line SL1 are disposed at a left side with respect to the module hole MH, and the other pixels among the pixels connected to the first signal line SL1 are disposed at a right side with respect to the module hole MH. Accordingly, the pixels connected to the first signal line SL1 and arranged in the same row may be turned on/off in response to substantially the same gate signal even though some pixels are omitted around the module hole MH.

The second signal line SL2 extends in the second direction DR2. The second signal line SL2 is connected to pixels arranged in the same column along the second direction DR2 among the pixels PX. The second signal line SL2 will be described as corresponding to a data line DL.

Some pixels among the pixels connected to the second signal line SL2 are disposed at an upper side with respect to the module hole MH, and the other pixels among the pixels connected to the second signal line SL2 are disposed at a lower side with respect to the module hole MH. Therefore, the pixels connected to the second signal line SL2 and arranged in the same column may receive the data signal through substantially the same line even though some pixels are omitted around the module hole MH.

The electronic panel 200 according to the illustrated exemplary embodiment may further include a connection pattern disposed in the hole area HA. In this case, the first signal line SL1 may be disconnected in an area overlapping with the hole area HA. The disconnected portions of the first signal line SL1 are connected to each other by the connection pattern. In addition, the second signal line SL2 may be disconnected in an area overlapping with the hole area HA, and a connection pattern that connects the disconnected portions of the second signal line may further be provided.

Referring to FIG. 3A again, a power pattern VDD may be disposed in the peripheral area NAA. In the illustrated exemplary embodiment, the power pattern VDD is connected to a plurality of power lines PL. Accordingly, as the display unit 210 includes the power pattern VDD, the same first power signal may be provided to each of the pixels PX.

The display pads DPD may include a first pad P1 and a second pad P2. The first pad P1 may be provided in a plural number, and the first pads P1 may be connected to the data lines DL, respectively. The second pad P2 may be connected to the power pattern VDD, and may be electrically connected to the power line PL. The display unit 210 may apply the electrical signals applied thereto from the outside to the pixels PX via the display pads DPD. The display pads DPD may further include pads in addition to the first and second pads P1 and P2 to receive other electrical signals.

Figure 4A:
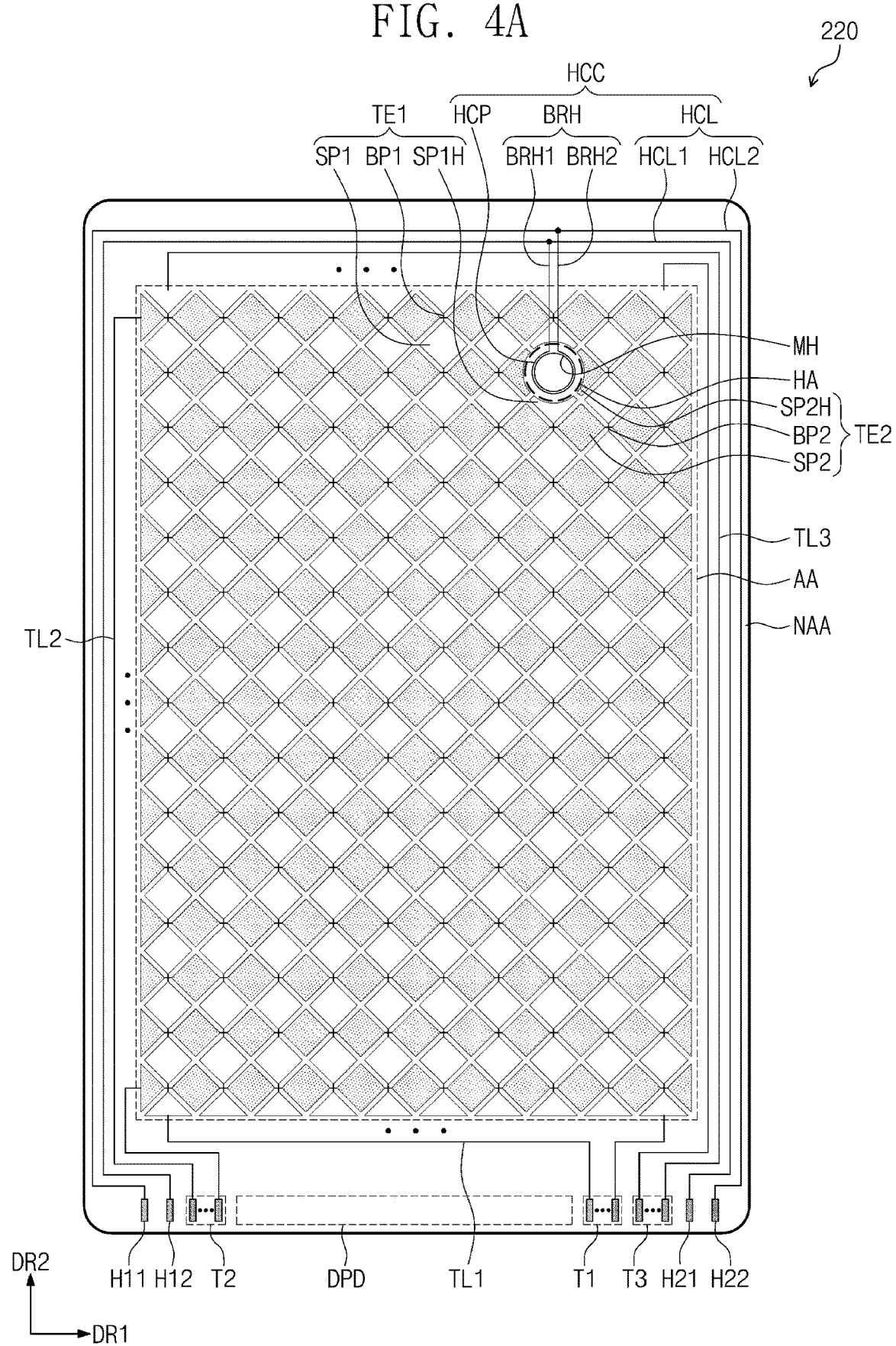
FIG. 4A is a plan view of a sensing unit according to an exemplary embodiment.
Figure 4B:
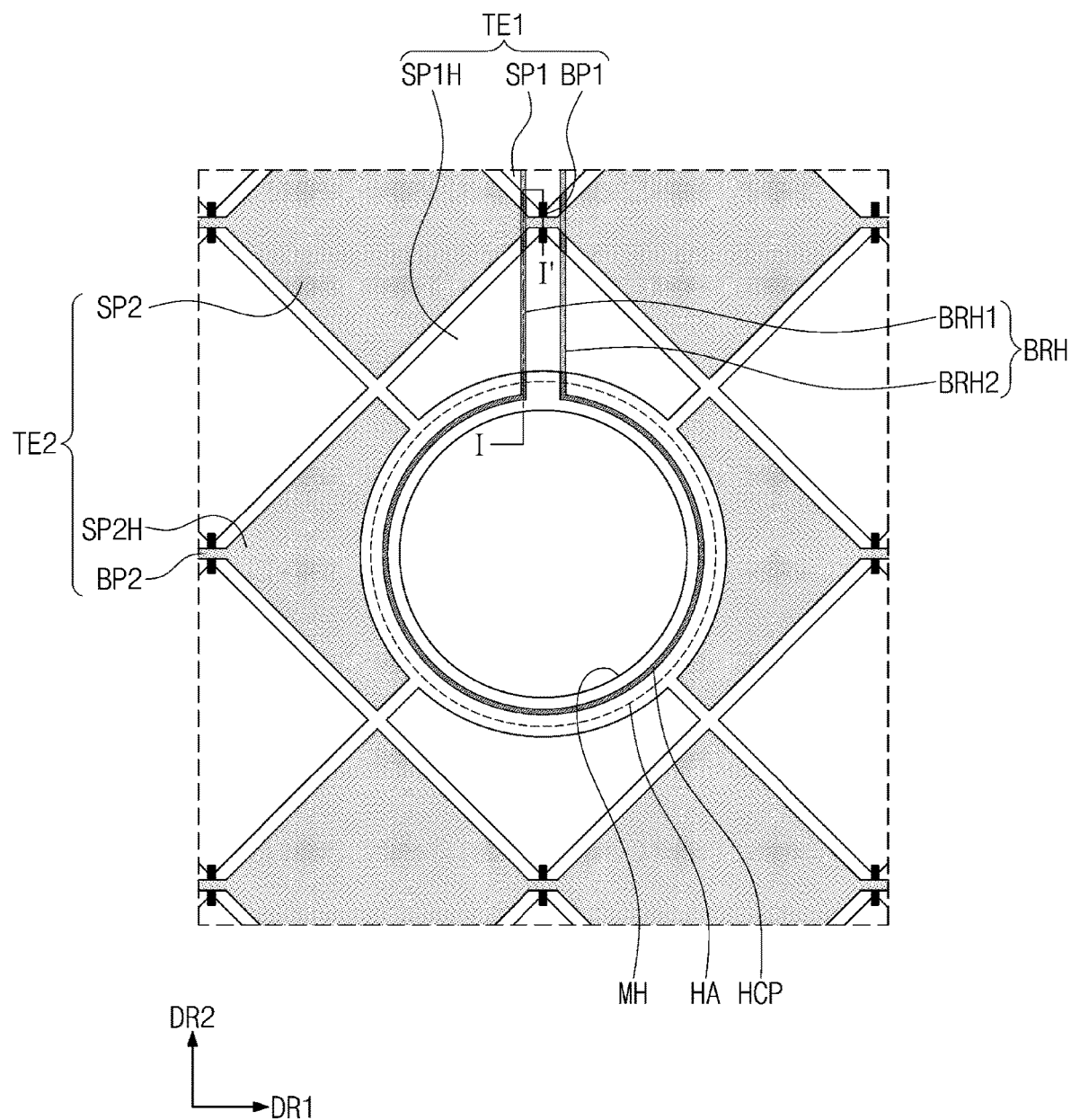
FIG. 4B is a plan view of a portion of an electronic panel according to an exemplary embodiment.
Figure 4C:
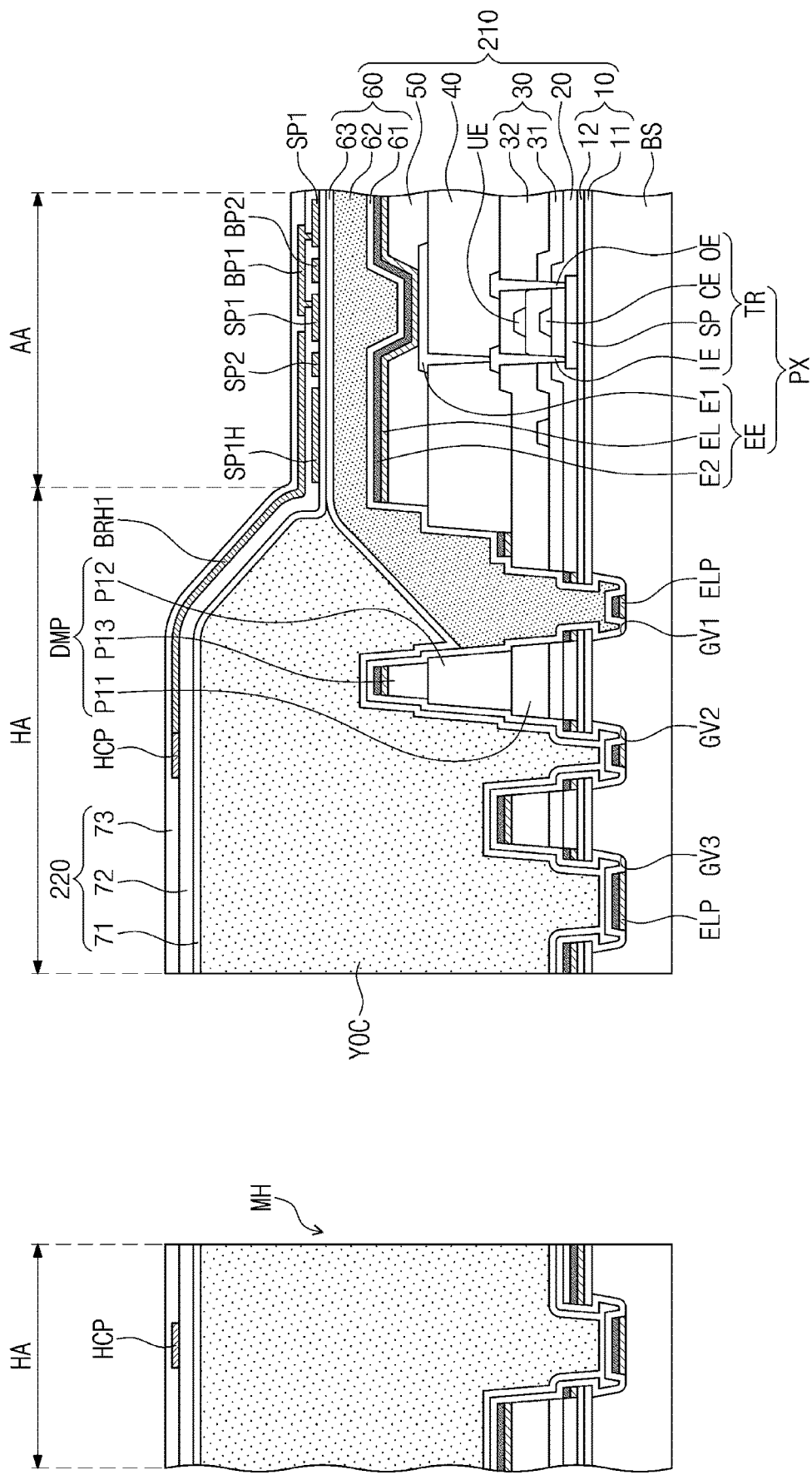
FIG. 4C is a cross-sectional view taken along line I-I' of FIG. 4B.

FIG. 4A is a plan view of a sensing unit according to an exemplary embodiment. FIG. 4B is a plan view of a portion of an electronic panel according to an exemplary embodiment. FIG. 4C is a cross-sectional view taken along line I-I' of FIG. 4B.

Referring to FIGS. 4A and 4B, the sensing unit 220 may be disposed on the display unit 210 (refer to FIG. 3A). The sensing unit 220 may sense the external input TC (refer to FIG. 1A) to obtain information about position and/or intensity of the external input TC. The sensing unit 220 may include a plurality of first sensing electrodes TE1, a plurality of second sensing electrodes TE2, a plurality of lines TL1, TL2, and TL3, and a plurality of sensing pads T1, T2, and T3.

The first sensing electrodes TE1 and the second sensing electrodes TE2 are arranged in the active area AA. The sensing unit 220 may obtain information about the external input TC based on a variation in capacitance between the first sensing electrodes TE1 and the second sensing electrodes TE2.

The first sensing electrodes TE1 may be arranged in the first direction DR1 and may extend in the second direction DR2. Each of the first sensing electrodes TE1 may include a first main pattern SP1, a first adjacent pattern SP1H, and a first connection pattern BP1. As used herein, the first main pattern SP1 and the first adjacent pattern SP1H may collectively be referred to as a "first sensing pattern".

The first main pattern SP1 of the first sensing pattern is spaced apart from the module hole MH. The first main pattern SP1 may have a predetermined shape and may have a first area. In the illustrated exemplary embodiment, the first main pattern SP1 may have a lozenge shape, however, the inventive concepts are not limited thereto. For example, in some exemplary embodiments, the first main pattern SP1 may have various shapes.

The first adjacent pattern SP1H of the first sensing pattern is disposed adjacent to the hole area HA. The first adjacent pattern SP1H may have a second area smaller than the first area of the first main pattern SP1. The first adjacent pattern SP1H may have a shape obtained by removing an area overlapping with the hole area HA from the lozenge shape of the first main pattern SP1.

The first connection pattern BP1 may extend along the second direction DR2. The first connection pattern BP1 may be connected to the first main pattern SP1. The first connection pattern BP1 may be disposed between two first main patterns SP1 to connect the two first main patterns SP1 to each other. As another example, the first connection pattern BP1 may be disposed between the first main pattern SP1 and the first adjacent pattern SP1H to connect the first main pattern SP1 and the first adjacent pattern SP1H, which are spaced apart from each other.

The second sensing electrodes TE2 may be arranged in the second direction DR2 and may extend in the first direction DR1. Each of the second sensing electrodes TE2 may include a second main pattern SP2, a second adjacent pattern SP2H, and a second connection pattern BP2. As used herein, the second main pattern SP2 and the second adjacent pattern SP2H may collectively be referred to as a "second sensing pattern".

The second main pattern SP2 of the second sensing pattern may be disposed to be spaced apart from the module hole MH. The second main pattern SP2 may be spaced apart from the first main pattern SP1. In the illustrated exemplary embodiment, the separation between the first main pattern SP1 and the second main pattern SP2 may be a separation in a cross-sectional view. For example, the first main pattern SP1 and the second main pattern SP2 may be disposed on the same layer and may be spaced apart from each other. The first main pattern SP1 and the second main pattern SP2 may not be in contact with each other, and may transmit and receive independent electrical signals.

In the illustrated exemplary embodiment, the second main pattern SP2 may have substantially the same shape as the first main pattern SP1. For example, the second main pattern SP2 may have the lozenge shape. However, the second main pattern SP2 may have various shapes in other exemplary embodiments, and the inventive concepts are not limited to a particular shape of the second main pattern SP2.

The second adjacent pattern SP2H of the second sensing pattern is disposed adjacent to the module hole MH. The second adjacent pattern SP2H may have an area smaller than an area of the second main pattern SP2. The second adjacent pattern SP2H may have a shape obtained by removing an area overlapping with the hole area HA from the lozenge shape of the second main pattern SP2.

The second connection pattern BP2 may extend along the first direction DR1. The second connection pattern BP2 may be connected to the second main pattern SP2. The second connection pattern BP2 may be disposed between two second main patterns SP2 to connect the two second main patterns SP2 to each other. As another example, the second connection pattern BP2 may be disposed between the second main pattern SP2 and the second adjacent pattern SP2H to connect the second main pattern SP2 and the second adjacent pattern SP2H.

The sensing lines TL1, TL2, and TL3 may be disposed in the peripheral area NAA. The sensing lines TL1, TL2, and TL3 may include first sensing lines TL1, second sensing lines TL2, and third sensing lines TL3.

The first sensing lines TL1 may be respectively connected to the first sensing electrodes TE1. In the illustrated exemplary embodiment, the first sensing lines TL1 may be respectively connected to one ends among both ends of the first sensing electrodes TE1 spaced apart from each other in the second direction DR2.

The second sensing lines TL2 may be respectively connected to one ends of the second sensing electrodes TE2. In the illustrated exemplary embodiment, the second sensing lines TL2 may be respectively connected to left ends among both ends of the second sensing electrodes TE2 spaced apart from each other in the first direction DR1.

The third sensing lines TL3 may be respectively connected to the other ends of the first sensing electrodes TE1 spaced apart from each other in the second direction DR2. In the illustrated exemplary embodiment, the first sensing electrodes TE1 may be respectively connected to the first sensing lines TL1 and the third sensing lines TL3. As such, the sensitivity with respect to an area of the first sensing electrodes TE1, which has a relatively greater length than that of the second sensing electrodes TE2, may be uniformly maintained. However, the inventive concepts are not limited thereto. For example, in some exemplary embodiments, the third sensing lines TL3 may be omitted in the sensing unit 220.

The sensing pads T1, T2, and T3 are disposed in the peripheral area NAA. The sensing pads T1, T2, and T3 may include first sensing pads T1, second sensing pads T2, and third sensing pads T3. The first sensing pads T1 may be respectively connected to the first sensing lines TL1 to apply external signal to the first sensing electrodes TE1. The second sensing pads T2 may be respectively connected to the second sensing lines TL2 and may be electrically connected to the second sensing electrodes TE2, and the third sensing pads T3 may be respectively connected to the third sensing lines TL3 and may be electrically connected to the second sensing electrodes TE2.

The sensing unit 220 may include a crack sensing portion HCC. The crack sensing portion HCC receives an independent electrical signal from the first sensing electrodes TE1 and the second sensing electrodes TE2. The crack sensing portion HCC may include a crack sensing pattern HCP, a crack sensing line HCL, and a connection line BRH.

The crack sensing pattern HCP may be disposed in the hole area HA. The crack sensing pattern HCP extends along an edge of the hole area HA in the hole area HA. In the illustrated exemplary embodiment, the crack sensing pattern HCP may have an open-curve shape that surrounds portions of the edge of the module hole MH.

The crack sensing pattern HCP includes a conductive material. The crack sensing pattern HCP may have a conductivity. In the illustrated exemplary embodiment, the crack sensing pattern HCP may have an integral shape.

The crack sensing line HCL is disposed in the peripheral area NAA. In the illustrated exemplary embodiment, the crack sensing line HCL is disposed further away from the active area AA than the first, second, and third sensing lines TL1, TL2, and TL3.

The crack sensing line HCL is electrically connected to the crack sensing pattern HCP. The crack sensing line HCL may include a first line HCL1 and a second line HCL2, which are spaced apart from each other.

One end of the first line HCL1 is connected to a second pad H11, and one end of the second line HCL2 is connected to a first pad H12. The first pad H11 and the second pad H12 may be disposed to be spaced apart from an area, in which the display pads DPD are disposed. For example, the first pad H11 and the second pad H12 may be disposed at a left side with respect to the area, in which the display pads DPD are disposed.

The other end of the first line HCL1 is connected to a third pad H21, and the other end of the second line HCL2 is connected to a fourth pad H22. The third pad H21 and the fourth pad H22 may be disposed to be spaced apart from the area, in which the display pads DPD are disposed. For example, the third pad H21 and the fourth pad H22 may be disposed at a right side with respect to the area, in which the display pads DPD are disposed. The first pad H11 and the second pad H12 are disposed to be spaced apart from the third pad H21 and the fourth pad H22 with the display pads DPD interposed therebetween.

The connection line BRH includes a first connection line BRH1 and a second connection line BRH2. The first connection line BRH1 connects the first line HCL1 and one end of the crack sensing pattern HCP. The second connection line BRH2 connects the second line HCL2 and the other end of the crack sensing pattern HCP.

In the illustrated exemplary embodiment, the first connection line BRH1 and the second connection line BRH2 may be spaced apart from each other in a cross-section or in a plane. The first connection line BRH1 extends in the second direction DR2 to connect the one end of the crack sensing pattern HCP and the first line HCL1. The second connection line BRH2 extends in the second direction DR2 to connect the other end of the crack sensing pattern HCP and the second line HCL2.

Accordingly, the first and second connection lines BRH1 and BRH2 may extend to the peripheral area NAA from the hole area HA along the second direction DR2 via the active area AA.

In the illustrated exemplary embodiment, the connection line BRH may be spaced apart from an overlapped pattern among the patterns of the first sensing electrode TE1 and the second sensing electrode TE2 in a cross-section or in a plane. Therefore, the connection line BRH may be electrically insulated from the first sensing electrode TE1 and the second sensing electrode TE2, which will be described in more detail later.

According to an exemplary embodiment, it is possible to determine whether a defect, such as a crack, is generated in the hole area HA, which physically penetrates the electronic panel 200, or in the peripheral area NAA using the crack sensing portion HCC.

In the crack sensing portion HCC, the first pad H11 and the third pad H21 may function as input terminals, and the second pad H12 and the fourth pad H22 may function as output terminals.

The electrical signal received through the first pad H11 may pass the crack sensing pattern HCP via the second line HCL2. Then, the electrical signal output from the crack sensing pattern HCP is output to the second pad H12 through the first line HCL1.

Similarly, the electrical signal received through the third pad H21 may pass the crack sensing pattern HCP via the first line HCL1. Then, the electrical signal output from the crack sensing pattern HCP is output to the fourth pad H22 through the first line HCL1.

For example, when signals respectively sensed from the second pad H12 and the fourth pad H22 are detected as defective, such as the sensed signals having a low level or a zero (0) level value with respect to a reference signal, there is a high possibility that both the first and second lines HCL1 and HCL2 may have been damaged or the crack sensing pattern HCP may have been damaged. In this manner, it is possible to determine whether the crack has occurred in the hole area HA.

As another example, when the signal sensed from only one of the second pad H12 and the fourth pad H22 is not detected as defective, there is a high possibility that the crack sensing line HCL may have been damaged. As such, it is possible to determine whether the crack has occurred in the peripheral area NAA.

However, the inventive concepts are not limited thereto. For example, in some exemplary embodiments, the first pad H11 and third pad H21 may function as output terminals, and the second pad H12 and the fourth pad H22 may function as input terminals.

Referring to FIG. 4C, the display unit 210 and the sensing unit 220 of the electronic panel 200 may be stacked one over another in the third direction DR3. The display unit 210 includes the base substrate BS, the pixel PX, a plurality of insulating layers 10, 20, 30, 40, and 50, and an encapsulation layer 60.

The pixel PX shown in FIG. 4C shows a thin film transistor TR corresponding to the second thin film transistor TR2 and the light emitting element EE among the components of the equivalent circuit diagram of the pixel PX shown in FIG. 3A. The insulating layers 10, 20, 30, 40, and 50 may include first, second, third, fourth, and fifth insulating layers 10, 20, 30, 40, and 50, which are sequentially stacked. Each of the first, second, third, fourth, and fifth insulating layers 10, 20, 30, 40, and 50 may include an organic material and/or an inorganic material, and may have a single-layer or multi-layer structure.

The first insulating layer 10 is disposed on the base substrate BS to cover a front surface of the base substrate BS. The first insulating layer 10 may include a barrier layer 11 and/or a buffer layer 12. As such, the first insulating layer 10 may prevent oxygen or moisture flowing through the base substrate BS from entering the pixel PX, or may lower a surface energy of the base substrate BS, such that the pixel PX is stably formed on the base substrate BS.

However, the inventive concepts are not limited thereto. For example, in some exemplary embodiments, at least one of the barrier layer 11 and the buffer layer 12 may be omitted from the first insulating layer 10, and the first insulating layer 10 may have a structure, in which plural layers are stacked one over another.

The thin film transistor TR is disposed on the first insulating layer 10. The thin film transistor TR includes a semiconductor pattern SP, a control electrode CE, an input electrode IE, and an output electrode OE. The semiconductor pattern SP is disposed on the first insulating layer 10.

The semiconductor pattern SP may include a semiconductor material. The control electrode CE may be spaced apart from the semiconductor pattern SP with the second insulating layer 20 interposed therebetween. The control electrode CE may be connected to the first thin film transistor TR1 (refer to FIG. 3A) and one electrode of the capacitor CP (refer to FIG. 3A).

The input electrode IE and the output electrode OE are disposed on the third insulating layer 30, and are spaced apart from each other when viewed in a plan view. The input electrode IE and the output electrode OE are respectively connected to one side and the other side of the semiconductor pattern SP after penetrating through the second insulating layer 20 and the third insulating layer 30.

The display unit 210 according to the illustrated exemplary embodiment may further include an upper electrode UE. Accordingly, the third insulating layer 30 may include a lower layer 31 and an upper layer 32. The upper electrode UE is disposed between the lower layer 31 and the upper layer 32. The upper electrode UE may overlap with the control electrode CE when viewed in a plan view.

In the illustrated exemplary embodiment, the upper electrode UE may receive substantially the same electrical signal as that applied to the control electrode CE, or may receive different electrical signal from that applied to the control electrode CE, to function as one electrode of the capacitor. However, the inventive concepts are not limited thereto. For example, in some exemplary embodiments, the upper electrode UE may be omitted from the electronic panel 200.

The fourth insulating layer 40 is disposed on the third insulating layer 30 to cover the input electrode IE and the output electrode OE. In the thin film transistor TR, the semiconductor pattern SP may be disposed on the control electrode CE.

As another example, the semiconductor pattern SP may be disposed on the input electrode IE and the output electrode OE. Alternatively, the input electrode IE and the output electrode OE may be disposed on the same layer as the semiconductor pattern SP, and may be directly connected to the semiconductor pattern SP. As described above, the inventive concepts are not limited to a particular structure of the thin film transistor TR, and the thin film transistor TR may have various structures known in the art.

The light emitting element EE is disposed on the fourth insulating layer 40. The light emitting element EE includes a first electrode E1, an organic layer EL, and a second electrode E2.

The first electrode E1 may be connected to the thin film transistor TR after penetrating through the fourth insulating layer 40. In some exemplary embodiments, the electronic panel 200 may further include a separate connection electrode disposed between the first electrode E1 and the thin film transistor TR, and in this case, the first electrode E1 may be electrically connected to the thin film transistor TR via the connection electrode.

The fifth insulating layer 50 is disposed on the fourth insulating layer 40. The fifth insulating layer 50 may include an organic material and/or an inorganic material, and may have a single-layer or multi-layer structure. The fifth insulating layer 50 may be provided with an opening defined therethrough. At least a portion of the first electrode E1 may be exposed through the opening. The fifth insulating layer 50 may be a pixel definition layer, without being limited thereto.

The organic layer EL is disposed between the first electrode E1 and the second electrode E2. The organic layer EL may include at least one light emitting layer. For example, the organic layer EL may include a material that emits at least one of red, green, and blue light, and may include a fluorescent material or a phosphorescent material. The organic layer EL may include an organic light emitting material or an inorganic light emitting material. The organic layer EL may emit light in response to a difference in electric potential between the first electrode E1 and the second electrode E2.

The organic layer EL is illustrated as having a layer that has a single unitary form overlapping with a plurality of openings, however, the inventive concepts are not limited thereto. For example, in some exemplary embodiments, the organic layer EL may be provided as a plurality of patterns corresponding to the openings, respectively.

The organic layer EL may further include an electric charge control layer in addition to the light emitting layer. The electric charge control layer may control a movement of electric charges to improve a light emission efficiency and a lifespan of the light emitting element EE. In this case, the organic layer EL may include at least one of a hole transport material, a hole injection material, an electron transport material, and an electron injection material.

The second electrode E2 is disposed on the organic layer EL. The second electrode E2 may face the first electrode E1. The second electrode E2 may extend from the active area AA to the peripheral area NAA, and may have a single unitary form. The second electrode E2 may be commonly provided in the pixels. The light emitting element EE disposed in each of the pixels may receive a common power voltage (hereinafter, referred to as a "second power voltage") via the second electrode E2.

The second electrode E2 may include a transmissive conductive material or a semi-transmissive conductive material. Accordingly, light generated by the light emitting element EE may easily travel in the third direction DR3 via the second electrode E2. However, the inventive concepts are not limited thereto. For example, depending on its design, the light emitting element EE in some exemplary embodiments may be operated in a rear surface light emitting manner, in which the first electrode E1 includes the transmissive or semi-transmissive material, or a both surface light emitting manner, in which the light is emitted to both of the front and rear surfaces.

The encapsulation layer 60 is disposed on the light emitting element EE to encapsulate the light emitting element EE. In some exemplary embodiments, a capping layer may further be disposed between the second electrode E2 and the encapsulation layer 60 to cover the second electrode E2.

The encapsulation layer 60 may include a first inorganic layer 61, an organic layer 62, and a second inorganic layer 63, which are sequentially stacked in the third direction DR3. However, the inventive concepts are not limited thereto, and in some exemplary embodiments, the encapsulation layer 60 may further include a plurality of inorganic layers and organic layers.

The first inorganic layer 61 may cover the second electrode E2. The first inorganic layer 61 may prevent external moisture or oxygen from entering the light emitting element EE. For example, the first inorganic layer 61 may include silicon nitride, silicon oxide, or a compound thereof. The first inorganic layer 61 may be formed by a chemical vapor deposition process.

The organic layer 62 is disposed on the first inorganic layer 61 to make contact with the first inorganic layer 61. The organic layer 62 may provide a flat surface on the first inorganic layer 61. An uneven shape formed on the upper surface of the first inorganic layer 61 or particles existing on the first inorganic layer 61 may be covered by the organic layer 62, and thus, an influence of a surface state of the upper surface of the first inorganic layer 61 exerted on components formed on the organic layer 62 may be prevented. In addition, the organic layer 62 may relieve a stress between layers making contact with each other. The organic layer 62 may include an organic material, and may be formed by a solution process, such as a spin coating, a slit coating, or an inkjet process.

The second inorganic layer 63 is disposed on the organic layer 62 to cover the organic layer 62. The second inorganic layer 63 may be stably formed on a relatively flat surface, rather than being disposed on the first inorganic layer 61. The second inorganic layer 63 may include silicon nitride, silicon oxide, or a compound thereof. The second inorganic layer 63 may be formed by a chemical vapor deposition process.

The electronic panel 200 includes a planarization portion YOC. The planarization portion YOC is disposed between the display unit 210 and the sensing unit 220. The planarization portion YOC is disposed in the hole area HA between the display unit 210 and the sensing unit 220. The planarization portion YOC is covered by a first sensing insulating layer 71. The planarization portion YOC may include an organic material, and may be formed by a solution process, such as a spin coating, a slit coating, or an inkjet process.

The planarization portion YOC may provide a flat surface that compensates for a step difference formed by the components of the display unit 210 in the area adjacent to the hole area HA. Therefore, the flat surface may be provided in an area, in which the organic layer 62 is not disposed in the hole area HA.

Grooves GV1, GV2, and GV3 may be defined in the display unit 210. Among the grooves GV1, GV2, and GV3, a first groove GV1 may be adjacent to the active area AA, and second and third grooves GV2 and GV3 may overlap with the hole area HA. A groove GV shown in FIG. 3B corresponds to one of the first, second, and third grooves GV1, GV2, and GV3.

Each of the first, second, and third grooves GV1, GV2, and GV3 may have a closed line shape surrounding the module hole MH, or may have an intermittent line shape surrounding at least a portion of the edge of the module hole MH, without being limited thereto. FIG. 4C exemplarily shows the first, second, and third grooves GV1, GV2, and GV3 sequentially formed in a direction approaching the module hole MH.

Each of the first, second, and third grooves GV1, GV2, and GV3 may be defined by being recessed from the upper surface of the base substrate BS. Each of the first, second, and third grooves GV1, GV2, and GV3 may be formed by removing at least a portion of the base substrate BS. A deposition pattern ELP may be disposed in each of the first, second, and third grooves GV1, GV2, and GV3, and may be covered by at least one of the first inorganic layer 61 and the second inorganic layer 63. In addition, the first groove GV1 adjacent to the active area AA may be filled with the organic layer 62.

As the electronic panel 200 according to the illustrated exemplary embodiment includes the first, second, and third grooves GV1, GV2, and GV3, a continuity between the deposition pattern ELP and the light emitting element EE may be blocked. Accordingly, a penetration path of the external moisture or oxygen may be blocked, and thus, the elements arranged in the active area AA may be prevented from being damaged.

In addition, since the deposition pattern ELP disposed in each of the first, second, and third grooves GV1, GV2, and GV3 is covered by the first inorganic layer 61 or the second inorganic layer 63, the deposition pattern ELP may be prevented from moving to another element and from exerting influence on another element when the electronic panel 200 is manufactured. Therefore, a process reliability of the electronic panel 200 may be improved.

However, the inventive concepts are not limited thereto, and in some exemplary embodiments, at least one or more of the first, second, and third grooves GV1, GV2, and GV3 may be provided in a single unitary form, or may be omitted from the electronic panel 200.

A dam portion DMP is disposed in the hole area HA. The dam portion DMP restricts the area, in which the organic layer 62 is formed, and prevents the area formed with the organic layer 62 from expanding. The dam portion DMP may be provided in a plural number, and the dam portions DMP may be disposed between the first, second, and third grooves GV1, GV2, and GV3.

The dam portion DMP may have a stacking structure of first, second, and third layers P11, P12, and P13. However, the inventive concepts are not limited thereto, and in some exemplary embodiments, the dam portion DMP may have a single-layer structure.

The sensing unit 220 may include a plurality of conductive patterns and a plurality of sensing insulating layers 71, 72, and 73. The sensing insulating layers 71, 72, and 73 include first, second, and third sensing insulating layers 71, 72, and 73 that are sequentially stacked in the third direction DR3.

The first sensing insulating layer 71 may cover the planarization portion YOC. In the illustrated exemplary embodiment, the first sensing insulating layer 71 may cover an upper surface of the planarization portion YOC in the hole area HA, and may cover an upper surface of the second inorganic layer 63 in the active area AA.

The second sensing insulating layer 72 and the third sensing insulating layer 73 may have a single unitary form overlapping with the hole area HA and the active area AA. Each of the first, second, and third sensing insulating layers 71, 72, and 73 may include an inorganic layer and/or an organic layer. In the illustrated exemplary embodiment, each of the first, second, and third sensing insulating layers 71, 72, and 73 has a single-layer structure. However, in some exemplary embodiments, each of the first, second, and third sensing insulating layers 71, 72, and 73 may have a stacking structure of a plurality of layers making contact with each other.

Hereinafter, conductive patterns disposed between the first sensing insulating layer 71 and the second sensing insulating layer 72 among the conductive patterns may be referred to as a "first conductive pattern". In addition, conductive patterns disposed between the second sensing insulating layer 72 and the third sensing insulating layer 73 among the conductive patterns may be referred to as a "second conductive pattern".

FIG. 4C exemplarily shows a structure, in which the first conductive pattern includes components of the first sensing electrode TE1, except for the first connection pattern BP1, and the second sensing electrode TE2, and the second conductive pattern includes the first connection pattern BP1.

The crack sensing pattern HCP is disposed in the hole area HA. The crack sensing pattern HCP is disposed to be spaced apart from the first and second conductive patterns. Accordingly, the crack sensing pattern HCP may receive electrical signals independently from the first and second conductive patterns, and may be operated independently from the first and second conductive patterns.

In the illustrated exemplary embodiment, the crack sensing pattern HCP may be disposed on the planarization portion YOC. The crack sensing pattern HCP is disposed between the second sensing insulating layer 72 and the third sensing insulating layer 73. The crack sensing pattern HCP is disposed on the same layer as the second conductive patterns.

The crack sensing pattern HCP and the second conductive pattern may be substantially simultaneously formed using one mask. Therefore, manufacturing processes thereof may be simplified, and the process costs may be reduced. However, the inventive concepts are not limited thereto. In some exemplary embodiments, the crack sensing pattern HCP may be disposed on the same layer as the first conductive pattern.

The connection line BRH may be disposed on the same layer as the crack sensing pattern HCP. FIG. 4C exemplarily shows a structure, in which the first connection line BRH1 is disposed on the same layer as the crack sensing pattern HCP. The first connection line BRH1 is disposed between the second sensing insulating layer 72 and the third sensing insulating layer 73.

The connection line BRH may extend to the active area AA from the hole area HA along one direction. Thus, a portion of the connection line BRH may cross a stepped area formed by a height difference between the planarization portion YOC and the encapsulation layer 60.

A height from the lower surface of the base substrate BS to the upper surface of the planarization portion YOC making contact with the first sensing insulating layer 71 may be greater than a height from the lower surface of the base substrate BS to the upper surface of the encapsulation layer 60 making contact with the first sensing insulating layer 71. Accordingly, the planarization portion YOC may form a step difference with the encapsulation layer 60.

Figure 5A:
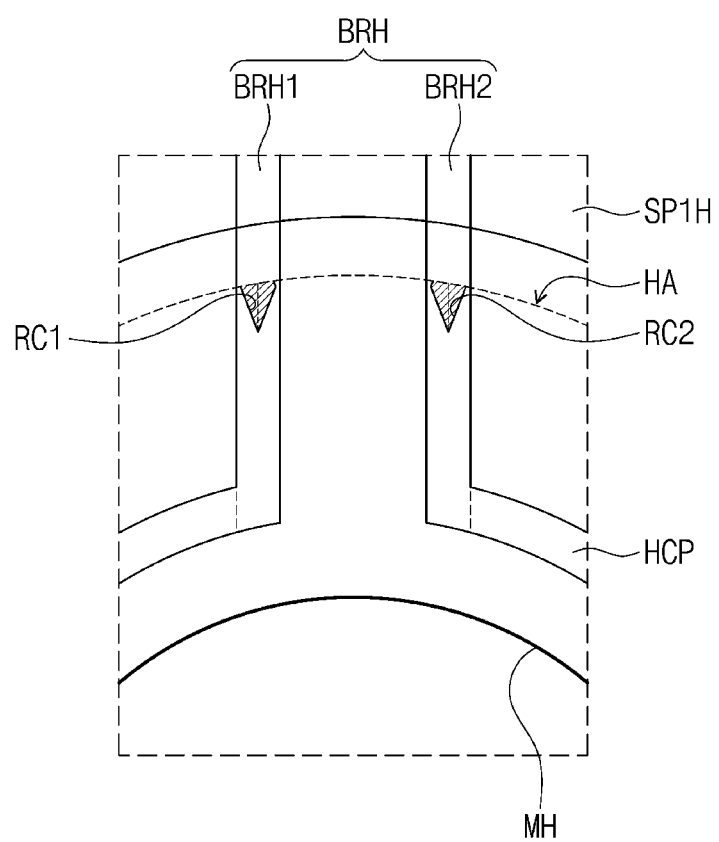
FIG. 5A is an enlarged plan view of a portion of an electronic panel according to an exemplary embodiment.
Figure 5B:
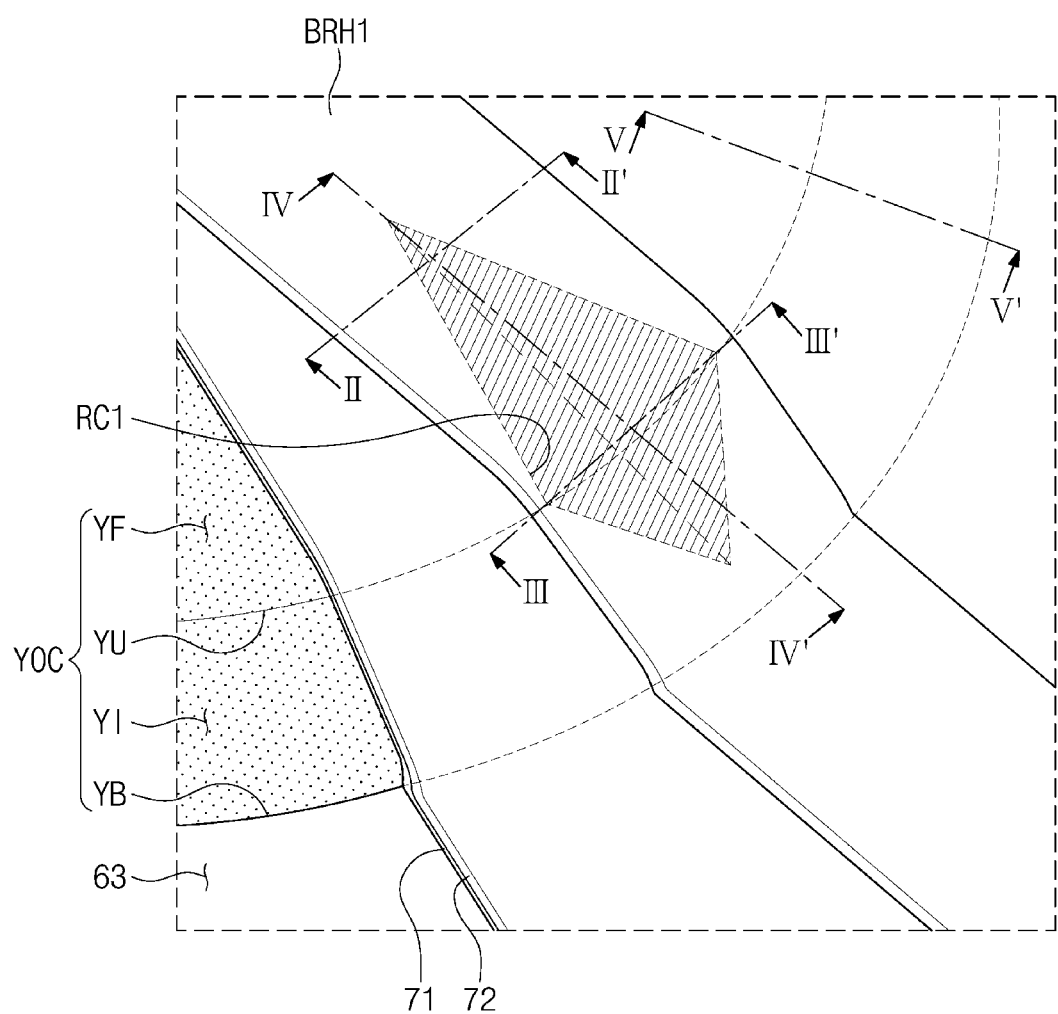
FIG. 5B is an enlarged perspective view of a portion of an electronic panel according to an exemplary embodiment.
Figure 6A:
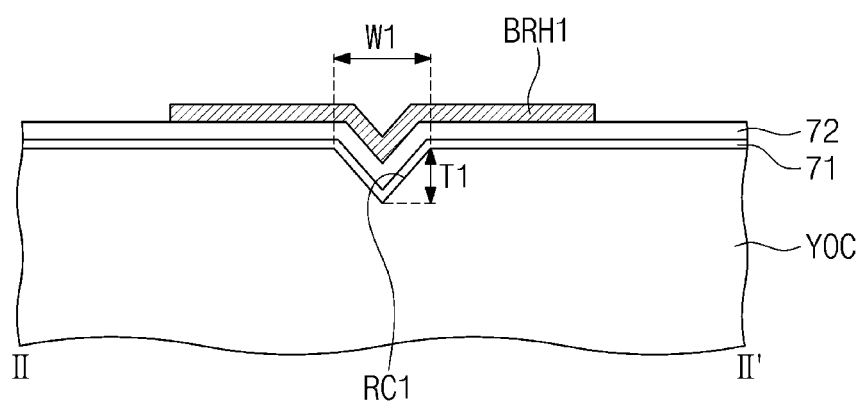
FIG. 6A is a cross-sectional view taken along line II-II' of FIG. 5B.
Figure 6B:
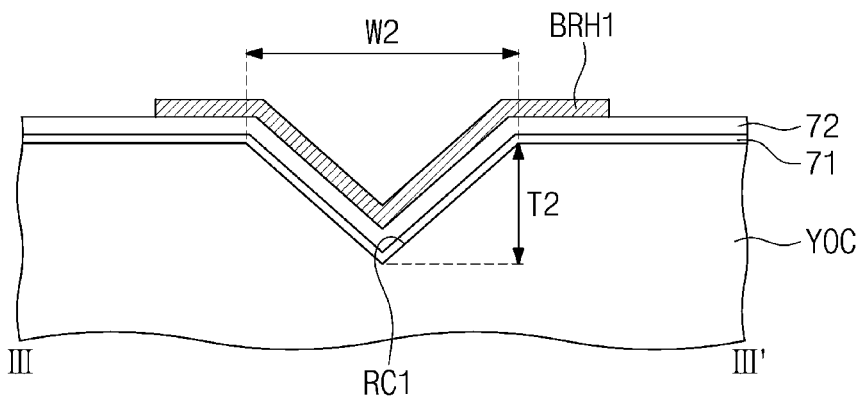
FIG. 6B is a cross-sectional view taken along line III-III' of FIG. 5B.
Figure 6C:
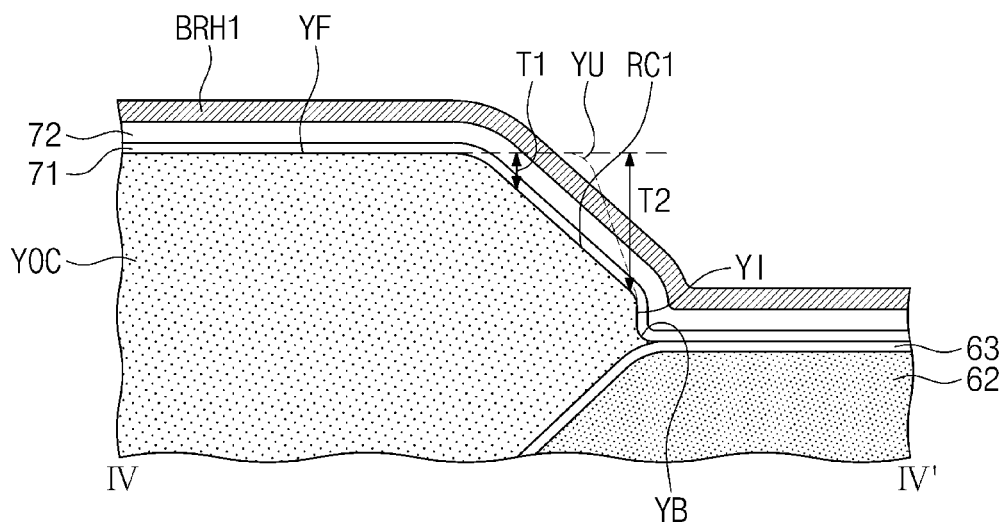
FIG. 6C is a cross-sectional view taken along line IV-IV' of FIG. 5B.
Figure 6D:
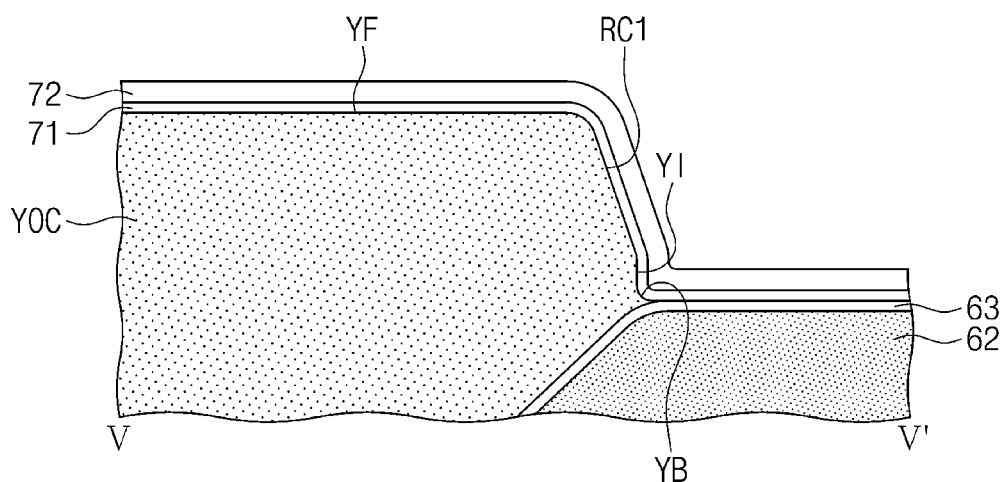
FIG. 6D is a cross-sectional view taken along line V-V' of FIG. 5B.

FIG. 5A is an enlarged plan view of a portion of an electronic panel according to an exemplary embodiment. FIG. 5B is an enlarged perspective view of a portion of an electronic panel according to an exemplary embodiment. FIG. 6A is a cross-sectional view taken along line II-II' of FIG. 5B. FIG. 6B is a cross-sectional view taken along line III-III' of FIG. 5B. FIG. 6C is a cross-sectional view taken along line IV-IV' of FIG. 5B. FIG. 6D is a cross-sectional view taken along line V-V' of FIG. 5B. FIG. 6C is a cross-sectional view of an area of the planarization portion YOC, which overlaps with a first recess portion RC1, and FIG. 6D is a cross-sectional view of an area of the planarization portion YOC, which does not overlap with the first recess portion RC1.

FIG. 5B exemplarily shows an enlarged plan view of the first and second sensing insulating layers 71 and 72 that cover a front surface of the planarization portion YOC and the second inorganic layer 63.

Referring to FIG. 5A, the planarization portion YOC may include recess portions RC1 and RC2. The recess portions RC1 and RC2 may overlap with the connection line BRH. For example, the first recess portion RC1 may overlap with the first connection line BRH1, and a second recess portion RC2 may overlap with the second connection line BRH2.

FIG. 5B is an enlarged view of the first recess portion RC1 overlapping with the first connection line BRH1 among the recess portions RC1 and RC2 shown in FIG. 5A. In FIG. 5B, some components are not illustrated, and the recess portions RC1 and RC2 are shown by shading. The second recess portion RC2 has a substantially the same structure as the first recess portion RC1, and thus, detailed descriptions thereof will be omitted.

The planarization portion YOC includes a flat surface YF and an inclined surface YI. The inclined surface YI may be inclined at a predetermined angle with respect to the flat surface YF. Hereinafter, a portion at which the flat surface YF makes contact with the inclined surface YI is referred to as an "upper end" YU, an edge of the inclined surface YI, which makes contact with the encapsulation layer 60, is referred to as a "lower end" YB, and an edge of the hole area HA may be substantially the same as the lower end YB of the planarization portion YOC.

The first recess portion RC1 may be an area recessed from the flat surface YF and the inclined surface YI. The first recess portion RC1 may be recessed from the flat surface YF to the thickness direction of the planarization portion YOC, and may be recessed from the inclined surface YI to the thickness direction of the inclined surface YI.

According to an exemplary embodiment, the first recess portion RC1 has a shape, whose width and thickness increase in a direction from the flat surface YF to the inclined surface YI.

The first recess portion RC1 overlaps with the first connection line BRH1. Accordingly, a portion of the first connection line BRH1, which overlaps with the first recess portion RC1, may have a shape corresponding to a shape of the first recess portion RC1. The first connection line BRH1 extends in one direction, and crosses the upper end YI and lower end YB of the planarization portion YOC.

FIGS. 6A and 6B are cross-sectional views respectively taken along the lines II-II' and III-III', to show a width between two portions spaced apart from each other in the extension direction of the first connection line BRH1.

Referring to FIGS. 6A to 6D, the first recess portion RC1 has the shape whose width and thickness increase in the direction from the flat surface YF to the inclined surface YI. For example, a portion of the first recess portion RC1, which overlaps with the line II-II', may have a first width W1 and a first thickness T1. A portion of the first recess portion RC1, which overlaps with the line may have a second width W2 and a second thickness T2. The thicknesses T1 and T2 may be a thickness defined from an imaginary plane extending from the flat surface YF.

The first width W1 is less than the second width W2, and the first thickness T1 is less than the second thickness T2. The width and the thickness of the first recess portion RC1 may be gradually increased in the direction from the flat surface YF to the inclined surface YI.

According to an exemplary embodiment, since the planarization portion YOC includes the first recess portion RC1 having a gentle inclination as compared with the inclined surface YI, the first connection line BRH1 may be prevented from being disconnected. Therefore, reliability of the electronic panel may be improved, which will be described in more detail later.

Figure 7A:
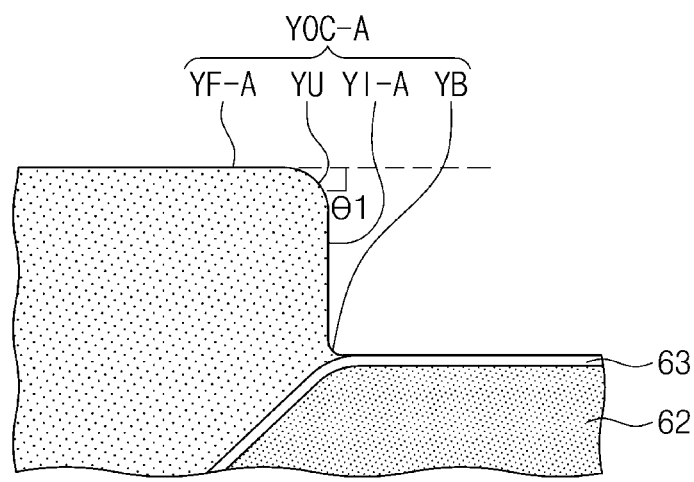
FIG. 7A is a cross-sectional view of a portion of an electronic panel according to an exemplary embodiment.
Figure 7B:
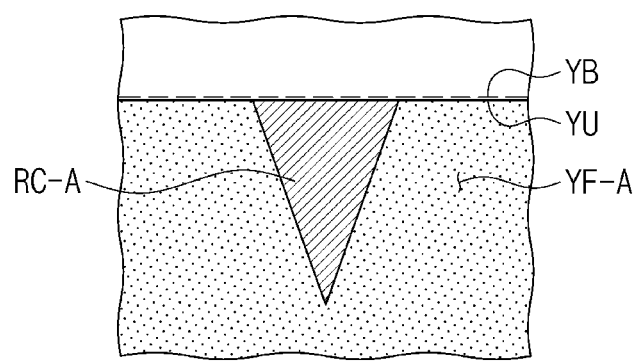
FIG. 7B is a plan view of a portion of an electronic panel according to an exemplary embodiment.
Figure 8A:
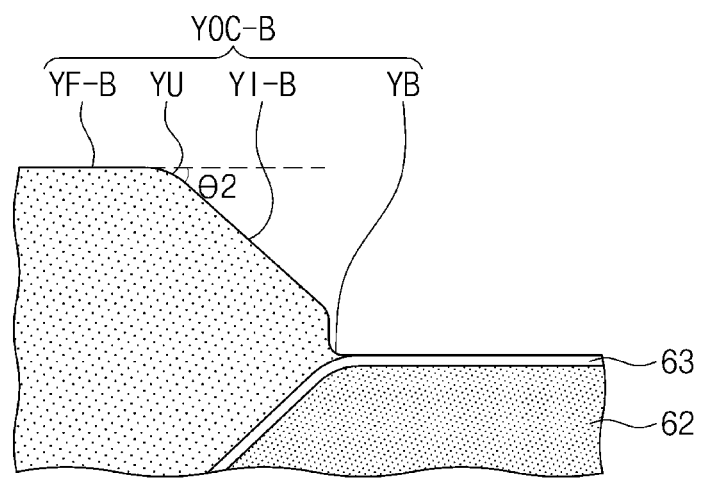
FIG. 8A is a cross-sectional view of a portion of an electronic panel according to an exemplary embodiment.
Figure 8B:
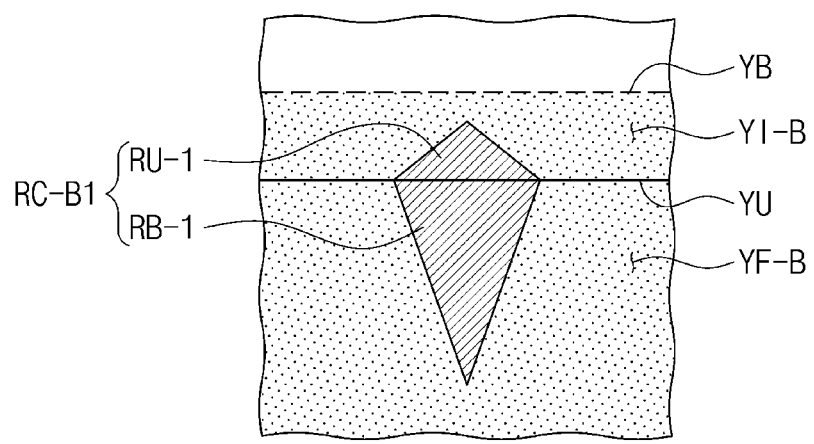
FIGS. 8B and 8C are plan views of a portion of an electronic panel according to exemplary embodiments.
Figure 8C:
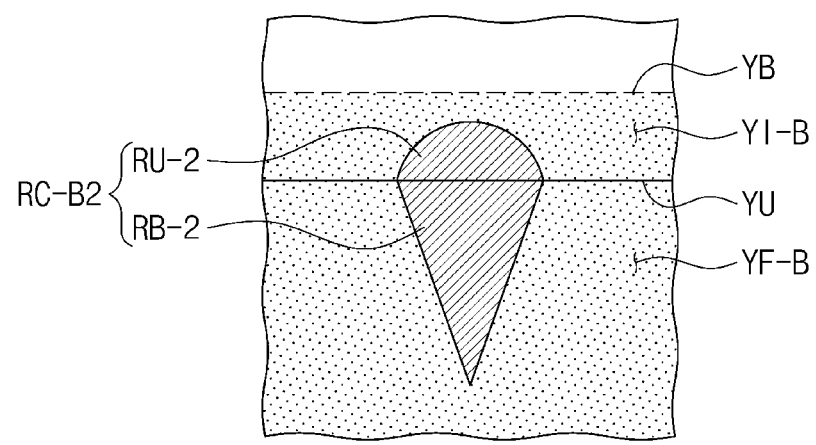

FIG. 7A is a cross-sectional view of a portion of an electronic panel according to an exemplary embodiment. FIG. 7B is a plan view of a portion of an electronic panel according to an exemplary embodiment. FIG. 8A is a cross-sectional view of a portion of an electronic panel according to an exemplary embodiment. FIGS. 8B and 8C are plan views of a portion of an electronic panel according to an exemplary embodiment. In FIGS. 7A to 8C, the same reference numerals denote the same elements shown in FIGS. 5A to 6D, and thus, repeated descriptions thereof will be omitted.

Referring to FIGS. 7A and 7B, a planarization portion YOC-A includes a flat surface YF-A and an inclined surface YI-A. The inclined surface YI-A may be inclined at a first inclination angle θ1 with respect to the flat surface YF-A. The first inclination angle θ1 according to an exemplary embodiment may be vertical. Accordingly, an upper end YU and an lower end YB may overlap with each other when viewed in a plan view.

When the first inclination angle θ1 is vertical, a recess portion RC-A may have a triangular shape when viewed in a plan view.

Referring to FIGS. 8A and 8B, a planarization portion YOC-B includes a flat surface YF-B and an inclined surface YI-B. The inclined surface YI-B may be inclined at a second inclination angle θ2 with respect to the flat surface YF-B.

The second inclination angle θ2 according to an exemplary embodiment may be an acute angle. Accordingly, an upper end YU and a lower end YB may be spaced apart from each other when viewed in a plan view.

When the second inclination angle θ2 is the acute angle, a recess portion RC-B1 may have a polygonal shape when viewed in a plan view. For example, a recess portion RB-1 of the recess portion RC-B1, which overlaps with the flat surface YF-B, may have a triangular shape, and a recess portion RU-1 of the recess portion RC-B1, which overlaps with the inclined surface YI-B, may have a triangular shape. As such, the shape of the recess portion RC-B1 may be a quadrangular shape.

Referring to FIG. 8C, a recess portion RC-B2 may have a shape different from the recess portion RC-B1. For example, a recess portion RB-2 of the recess portion RC-B2, which overlaps with the flat surface YF-B, may have a triangular shape, and a recess portion RU-2 of the recess portion RC-B1, which overlaps with the inclined surface YI-B, may have a semicircular or semi-elliptical shape.

Figure 9A:
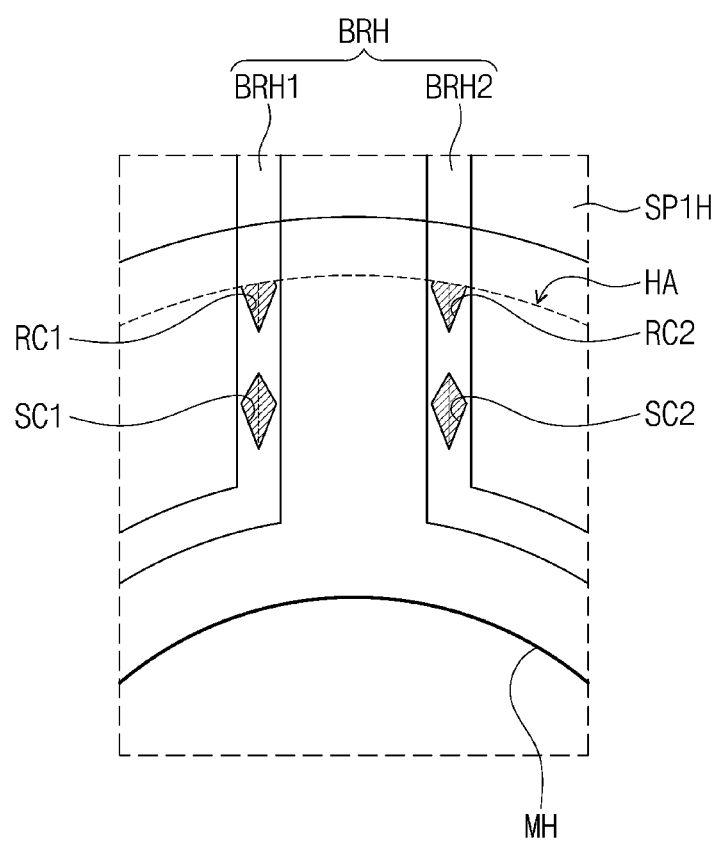
FIG. 9A is an enlarged plan view of a portion of an electronic panel according to an exemplary embodiment.
Figure 9B:
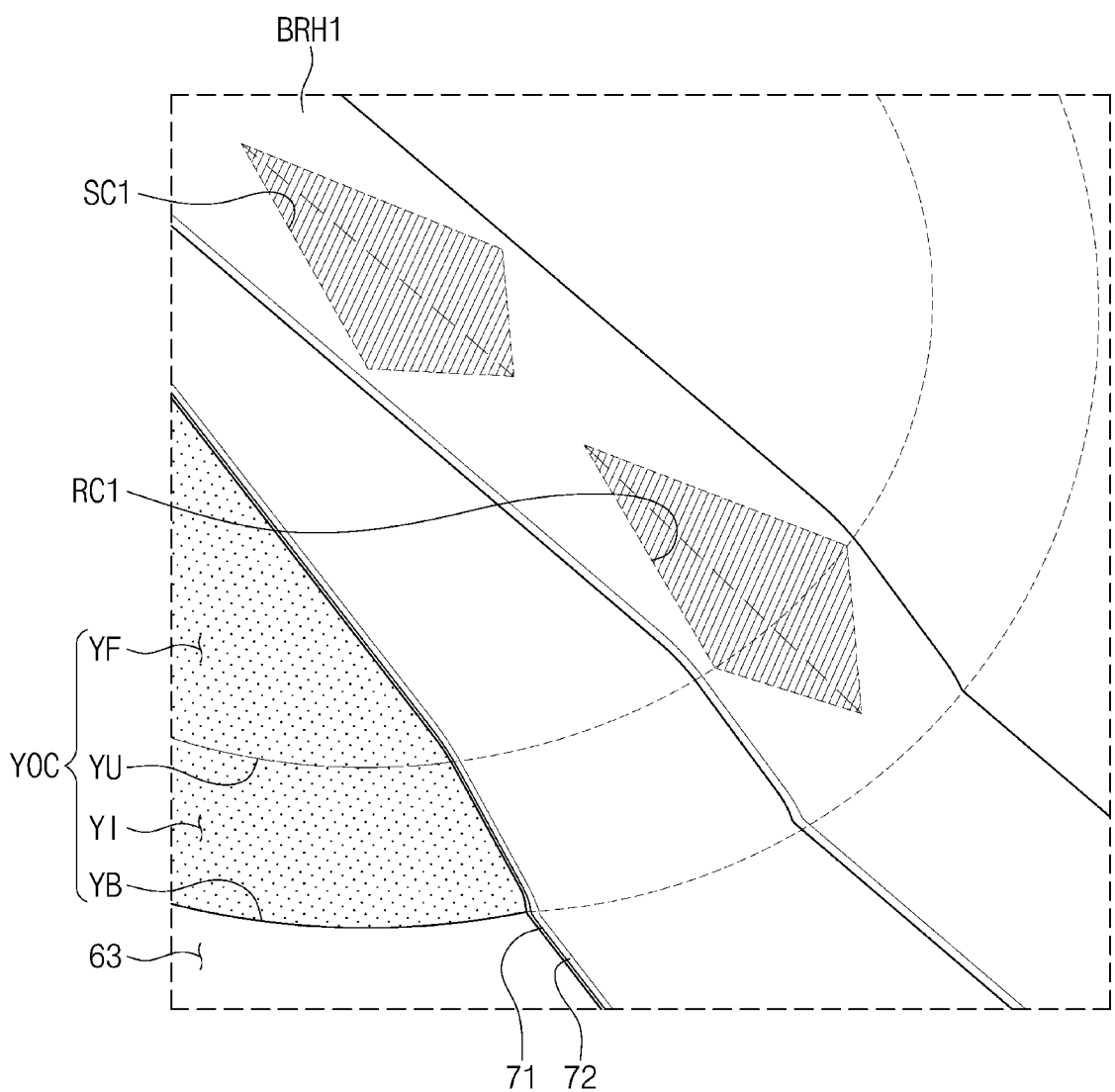
FIG. 9B is an enlarged perspective view of a portion of an electronic panel according to an exemplary embodiment.

FIG. 9A is an enlarged plan view of a portion of an electronic panel according to an exemplary embodiment. FIG. 9B is an enlarged perspective view of a portion of an electronic panel according to an exemplary embodiment. In FIGS. 9A and 9B, the same/similar reference numerals denote the same/similar elements shown in FIGS. 5A to 6D, and thus, repeated descriptions thereof will be omitted. FIGS. 9A and 9B exemplarily show of first and second sensing insulating layers 71 and 72 that cover a front surface of planarization portions YOC-1 and YOC-2 and the second inorganic layer 63.

Referring to FIGS. 9A and 9B, the planarization portion YOC-1 according to the illustrated exemplary embodiment includes recess portions RC1 and RC2 and additional recess portions SC1 and SC2. The recesses portions RC1 and RC2 may correspond to the recess portions RC1 and RC2 described with reference to FIGS. 5A to 6D. As such, hereinafter, the additional recess portions SC1 and SC2 will be described in more detail.

The additional recess portions SC1 and SC2 may be areas recessed from a flat surface YF of the planarization portion YOC-1. The additional recess portions SC1 and SC2 may be recessed from the flat surface YF along a thickness direction of the planarization portion YOC-1.

The additional recess portions SC1 and SC2 have a shape, whose width and thickness are varied in a direction from the flat surface YF to the inclined surface YI. In the illustrated exemplary embodiment, the recessed portion may have a triangular pyramid shape.

The additional recess portions SC1 and SC2 may overlap with corresponding connection lines BRH1 and BRH2. In addition, the additional recess portions SC1 and SC2 may be disposed to overlap with components having the step difference among the components included in the electronic panel 200. For example, the additional recess portions SC1 and SC2 may be disposed in areas overlapping with the dam portion DMP shown in FIG. 4C in the planarization portion YOC-1.

In this manner, since the additional recess portions SC1 and SC2 are formed between the components forming the step difference with adjacent components thereto and the connection line BRH of the electronic panel 200, the connection line BRH may be more easily formed.

Figure 10A:
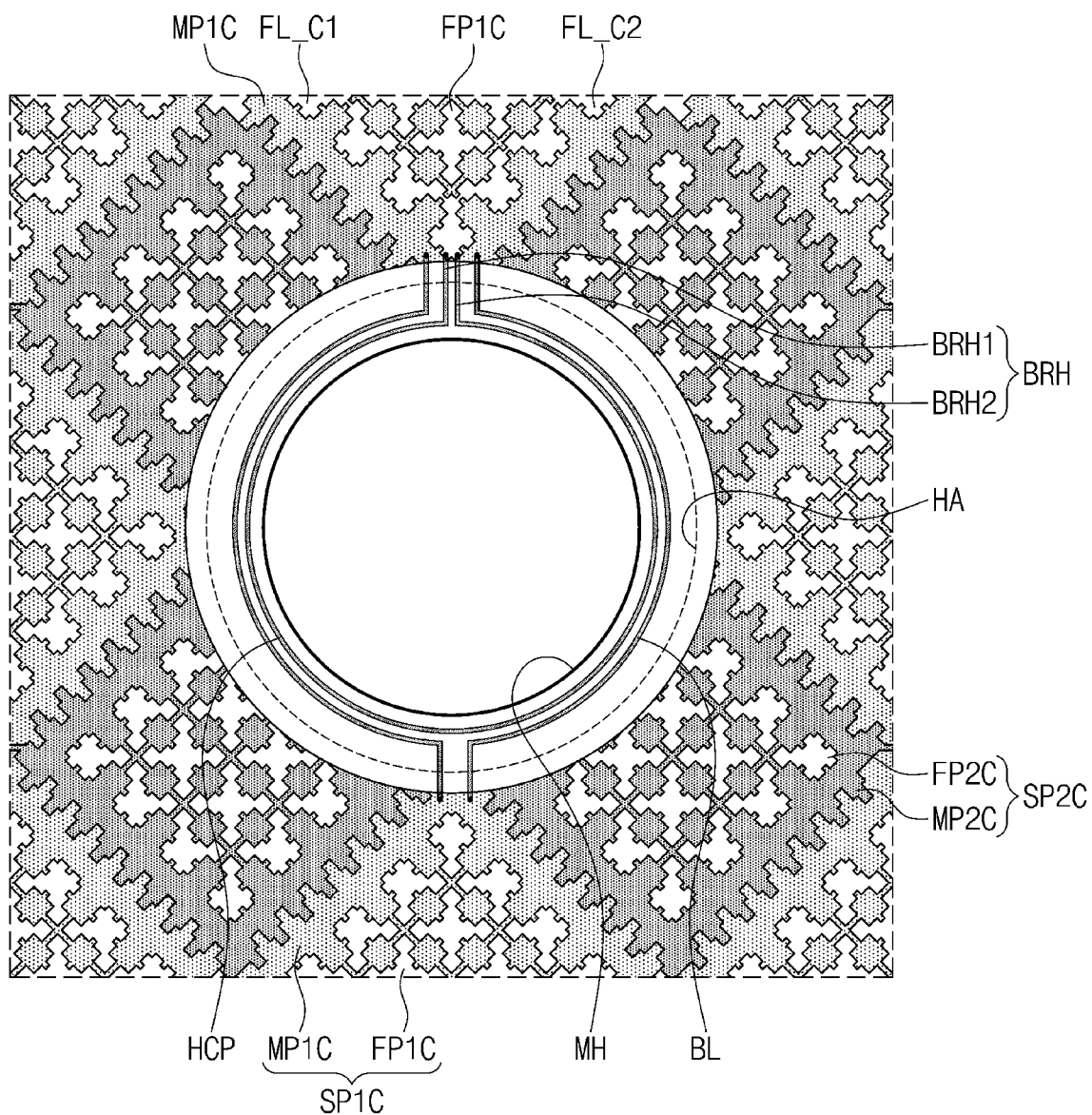
FIGS. 10A and 10B are plan views showing a portion of an electronic apparatus according to an exemplary embodiment.
Figure 10B:
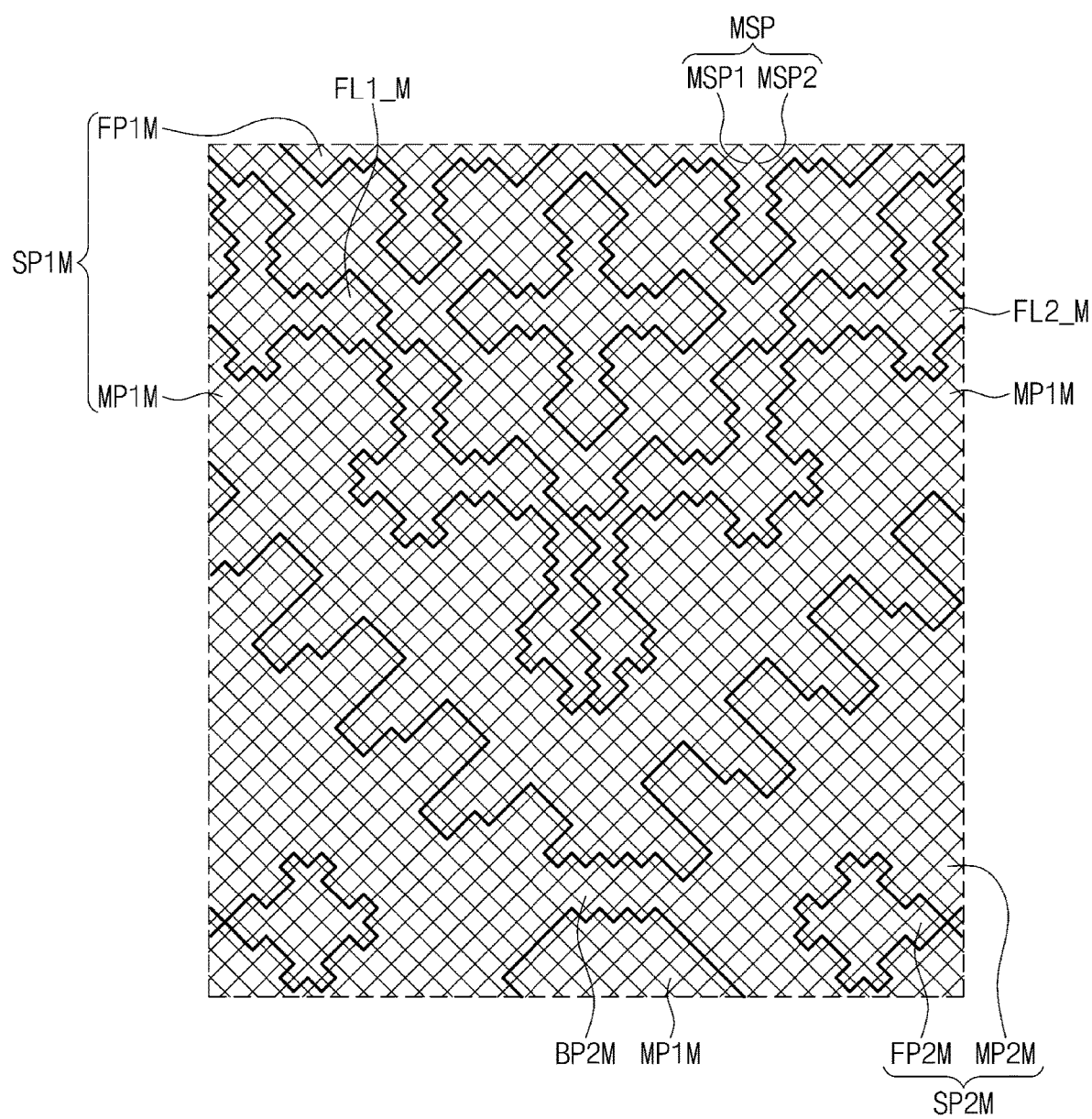

FIGS. 10A and 10B are plan views of a portion of an electronic apparatus according to an exemplary embodiment. In FIGS. 10A and 10B, the same/similar reference numerals denote the same/similar elements shown in FIGS. 1A to 6D, and thus, repeated descriptions thereof will be omitted. FIG. 10A schematically shows the hole area HA and the active area AA adjacent to the hole area HA. FIG. 10B exemplarily shows patterns disposed on the same layer only, and some components are omitted.

Referring to FIG. 10A, first sensing patterns SP1C and second sensing patterns SP2C may respectively include dummy pattern portions FP1C and FP2C. In particular, each of the first sensing patterns SP1C may include a main portion MP1C and a first dummy pattern portion FP1C spaced apart from the main portion MP1C. Each of the second sensing patterns SP2C may include a main portion MP2C and a plurality of second dummy pattern portions FP2C spaced apart from the main portion MP2C.

Portions of the dummy pattern portions FP1C and FP2C connected to the connection lines BRH1 and BRH2, which are connected to the crack sensing pattern HCP, may be defined as "floating patterns", and the floating patterns may be used as a portion of the connection lines BRH1 and BRH2.

In the illustrated exemplary embodiment, portions of the first dummy pattern portion FP1C, which is disposed on the crack sensing pattern HCP, among the first sensing patterns SP1C may be connected to each other to form a first floating pattern FL_C1 connected to the first connection line BRH1, and the other portions may be connected to each other to form a second floating pattern FL_C2. Among the dummy patterns FP1C and FP2C, remaining patterns that do not function as the first and second floating patterns FL_C1 and FL_C2 may be electrically separated from each other.

In the illustrated exemplary embodiment, a bridge pattern BL may connect the first sensing patterns to each other, which are spaced apart from each other with the module hole MH interposed therebetween. The bridge pattern BL may surround a portion of the module hole MH. The bridge pattern BL may connect the first sensing patterns to each other, which are deformed or partially removed by the module hole MH. FIG. 10A shows only the bridge pattern BL that connects the first sensing patterns to each other, which are spaced apart from each other with the module hole MH interposed therebetween. However, the inventive concepts are not limited thereto. In some exemplary embodiments, a bridge pattern that connects the second sensing patterns to each other, which are spaced apart from each other with the module hole MH interposed therebetween, may be additionally formed.

A first sensing pattern SP1M and a second sensing pattern SP2M shown in FIG. 10B may have shapes corresponding to those of the first sensing pattern SP1C and the second sensing pattern SP2C shown in FIG. 10A, and may include mesh lines. FIG. 10B exemplarily shows one first sensing pattern SP1M, one second sensing pattern SP2M, and one second connection pattern BP2M, which are disposed on the same layer, among components of the electronic panel 200.

The first sensing pattern SP1M and the second sensing pattern SP2M may include a plurality of mesh lines MSP. The mesh lines MSP define a plurality of openings. The openings may respectively overlap with light emitting areas that are respectively defined by the light emitting elements EE described above.

A boundary between the first sensing pattern SP1M and the second sensing pattern SP2M may be defined by disconnecting portions of the mesh lines MSP. In the illustrated exemplary embodiment, the disconnected portions of the mesh lines MSP are shown as a bold line. Referring to FIG. 10B, the boundary between the first sensing pattern SP1M and the second sensing pattern SP2M according to an exemplary embodiment has a zigzag shape defined by a plurality of curvatures.

The first sensing pattern SP1M includes a first main portion MP1M and a first dummy pattern portion FP1M. The first dummy pattern portion FP1M may be spaced apart from the first main portion MP1M when viewed in a plan view. The bold line surrounding the first dummy pattern portion FP1M may be a space to define boundaries between the first dummy pattern portion FP1M and the first main portion MP1M.

Each first dummy pattern portion FP1M may include the mesh lines MSP, and may be electrically insulated from mesh lines MSP forming adjacent first main portion MP1M. The first sensing pattern SP1M may be provided in a plural number, and the first sensing patterns SP1M may be spaced apart from each other.

In the illustrated exemplary embodiment, a first connection pattern may connect the first sensing patterns to each other. The first connection pattern may be disposed on a different layer from the first sensing pattern SP1M. Accordingly, the first connection pattern may be connected to the first sensing pattern SP1M through a predetermined contact hole.

The second sensing pattern SP2M includes a second main portion MP2M and a second dummy pattern portion FP2M. The second dummy pattern portion FP2M may be spaced apart from the second main portion MP2M when viewed in a plan view. The second sensing pattern SP2M may be provided in a plural number, and the second sensing patterns SP2M may be spaced apart from each other.

The second dummy pattern portion FP2M according to the illustrated exemplary embodiment is shown to have a shape different from the first dummy pattern portion FP1M, however, the inventive concepts are not limited thereto. For example, in some exemplary embodiments, the second dummy pattern portion FP2M may have substantially the same shape as the first dummy pattern portion FP1M.

A second connection pattern BP2M may connect the second sensing patterns. The second connection pattern BP2M may be disposed on the same layer as the second sensing pattern SP2M. The second connection pattern BP2M includes a plurality of mesh lines MSP. In the illustrated exemplary embodiment, the second connection pattern BP2M may be integrally provided with the second sensing pattern SP2M, more particularly, the second main portion MP2M.

The first dummy pattern portion FP1M and the second dummy pattern portion FP2M are disposed adjacent to each other while being spaced apart from each other. The disconnected mesh lines MSP may be formed between the first dummy pattern portion FP1M and the second dummy pattern portion FP2M.

According to an exemplary embodiment, floating patterns FL1_M and FL2_M may be disposed on the same layer as the first sensing pattern SP1M. The floating patterns FL1_M and FL2_M include a first floating pattern FL1_M and a second floating pattern FL2_M, which are spaced apart from each other. The floating patterns FL1_M and FL2_M shown in FIG. 10B may perform the same function as the floating patterns FL_C1 and FL_C2 described with reference to FIG. 10A. Therefore, the floating patterns FL1_M and FL2_M may be used as portions of the connection lines BRH1 and BRH2.

The first floating pattern FL1_M and the second floating pattern FL2_M are spaced apart from the main portion MP1M when viewed in a plan view. In addition, the first floating pattern FL1_M and the second floating pattern FL2_M may be spaced apart from the first dummy pattern portion FP1M when viewed in a plan view.

In the illustrated exemplary embodiment, the first floating pattern FL1_M and the second floating pattern FL2_M may be defined by connecting portions of the first dummy pattern portion FP1M. Accordingly, the first floating pattern FL1_M and the second floating pattern FL2_M may be surrounded by the first main portion MP1M, and may be disposed in the first sensing pattern SP1M.

According to the illustrated exemplary embodiment, first and second conductive patterns may be defined by the first and second sensing insulating layers 71 and 72 shown in FIG. 4C. For example, the first connection pattern may be disposed between the first sensing insulating layer 71 and the second sensing insulating layer 72, and may be defined as the first conductive pattern.

In addition, the first sensing pattern SP1M, the second sensing pattern SP2M, the second connection pattern BP2M, and the floating patterns FL1_M and FL2_M may be disposed between the second sensing insulating layer 72 and the third sensing insulating layer 73, and may be defined as the second conductive pattern.

Figure 11A:
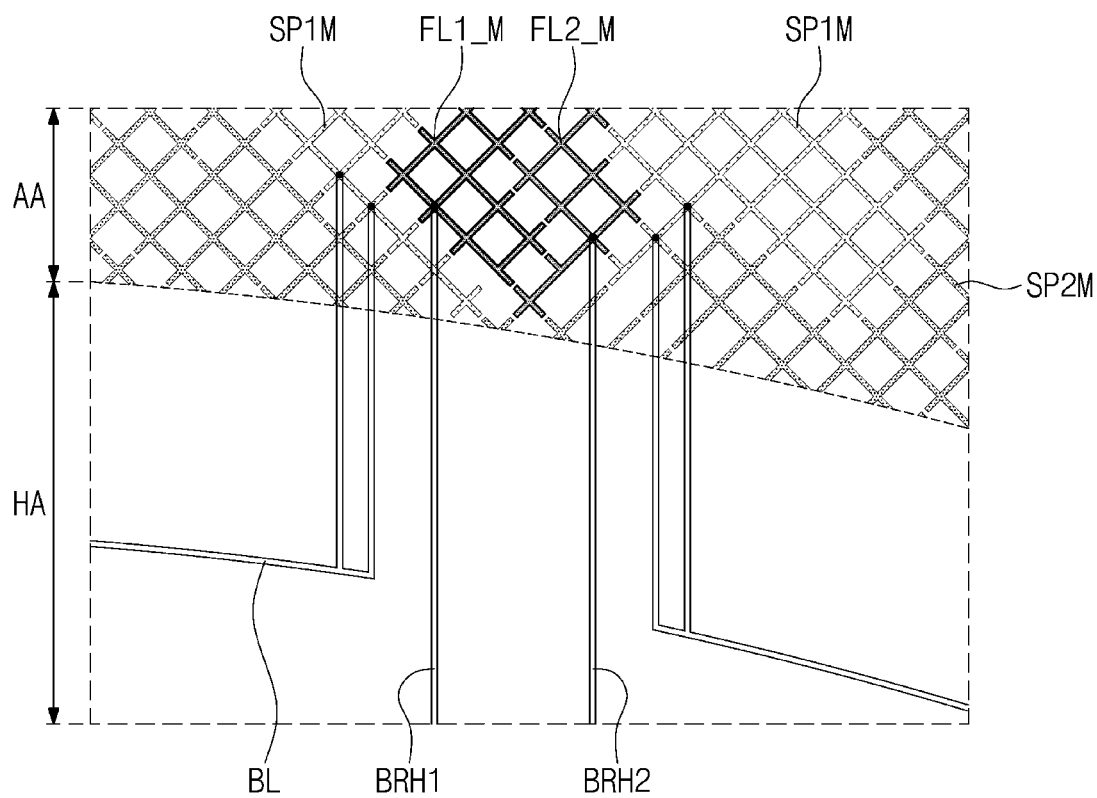
FIG. 11A is an enlarged plan view of the portion shown in FIG. 10A.
Figure 11B:
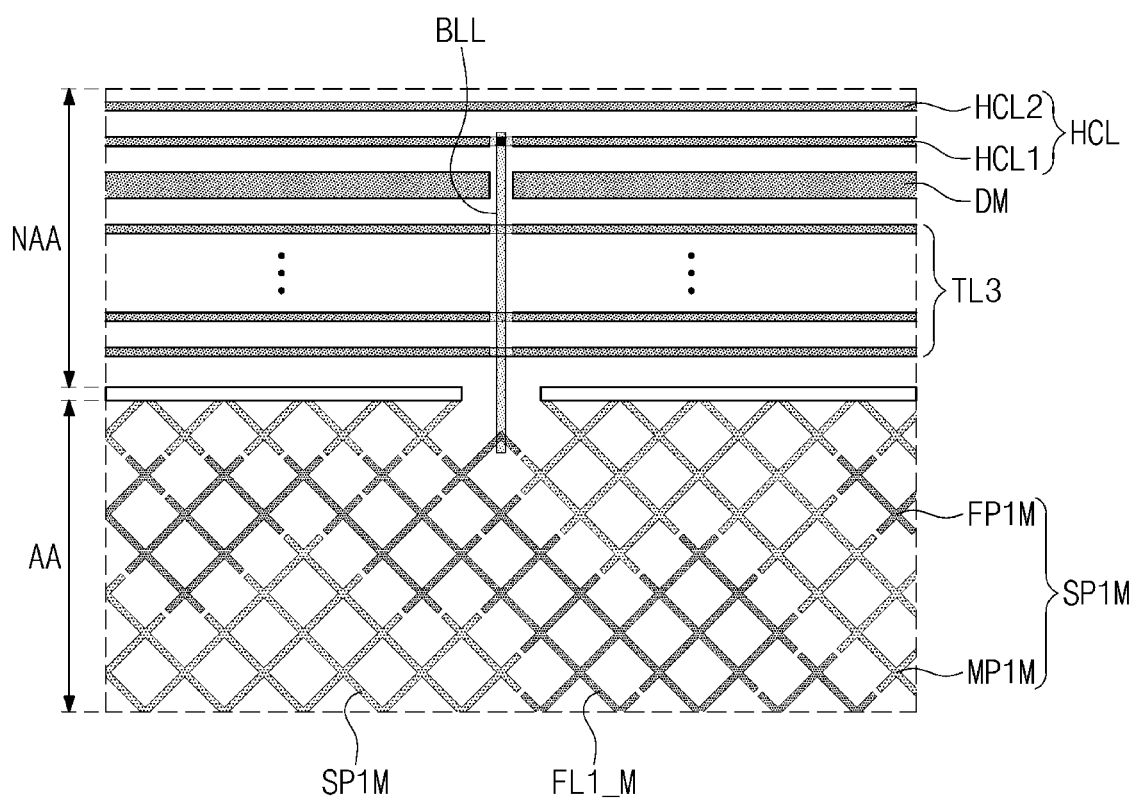
FIG. 11B is an enlarged plan view of the portion shown in FIG. 4A.

FIG. 11A is an enlarged plan view of the portion shown in FIG. 10A. FIG. 11B is an enlarged plan view of the portion shown in FIG. 4A. FIG. 11A shows a hole area HA and an active area AA adjacent to the hole area HA, and FIG. 11B shows a peripheral area NAA and the active area AA adjacent to the peripheral area NAA.

Referring to FIG. 11A, connection lines BRH1 and BRH2 extending to the active area AA from the hole area HA may be connected to floating patterns FL1_M and FL2_M. For example, a first connection line BRH1 may be connected to a first floating pattern FL1_M, and a second connection line BRH2 may be connected to a second floating pattern FL2_M. Therefore, the floating patterns FL1_M and FL2_M may be used as portions of the connection lines BRH1 and BRH2.

A bridge pattern BL may correspond to the bridge pattern BL described with reference to FIG. 10A. The bridge pattern BL may connect first sensing patterns to each other, which are spaced apart from each other.

FIG. 11B schematically shows a connection relation between a first floating pattern FL1_M among floating patterns FL1_M and FL2_M and a crack sensing line HCL. The floating patterns FL1_M and FL2_M may be connected to each other, and may extend to the peripheral area NAA from the active area AA. The first floating pattern FL1_M and the first line HCL1 may be connected to each other via a line connection portion BLL.

A second floating pattern FL2_M may extend to the peripheral area NAA from the active area AA, and may be connected to a second line HCL2 via a line connection portion that connects the second floating pattern FL2_M and the second line HCL2.

According to the illustrated exemplary embodiment, as the crack sensing pattern HCP and the crack sensing line HCL are connected to each other by using the floating patterns FL1_M and FL2_M, which are portions of the dummy patterns FP1M and FP2M of the sensing patterns SP1M and SP2M including the mesh lines, the process costs and time required to form a separate connection line may be reduced. In addition, since the floating patterns FL1_M and FL2_M include the mesh lines, the connection line may be prevented from being recognized from the outside. Thus, the visibility of the electronic panel may be improved.

The electronic panel according to the present illustrated embodiment may further include a dummy pattern DM. The dummy pattern DM is disposed between sensing lines TL3 and the crack sensing line HCL. The dummy pattern DM transmits an electrical signal different from the sensing lines TL3 and the crack sensing line HCL. As the dummy pattern DM is disposed between the sensing lines TL3 and the crack sensing line HCL, which transmit different electrical signals from the dummy pattern DM, a parasitic capacitance may be prevented from being generated between the sensing lines TL3 and the crack sensing line HCL. Accordingly, electrical characteristics of the electronic panel may be improved. However, the inventive concepts are not limited thereto, and in some exemplary embodiments, the dummy pattern DM may be omitted from the electronic panel.

FIGS. 12A to 12I are views showing a method of manufacturing an electronic panel according to an exemplary embodiment. In FIGS. 12A to 12I, the same/similar reference numerals denote the same/similar elements shows in FIGS. 1A to 6D, and thus, repeated descriptions thereof will be omitted. Hereinafter, the manufacturing method of the electronic panel according to an exemplary embodiment will be described with reference to FIGS. 12A to 12I.

Figure 12A:
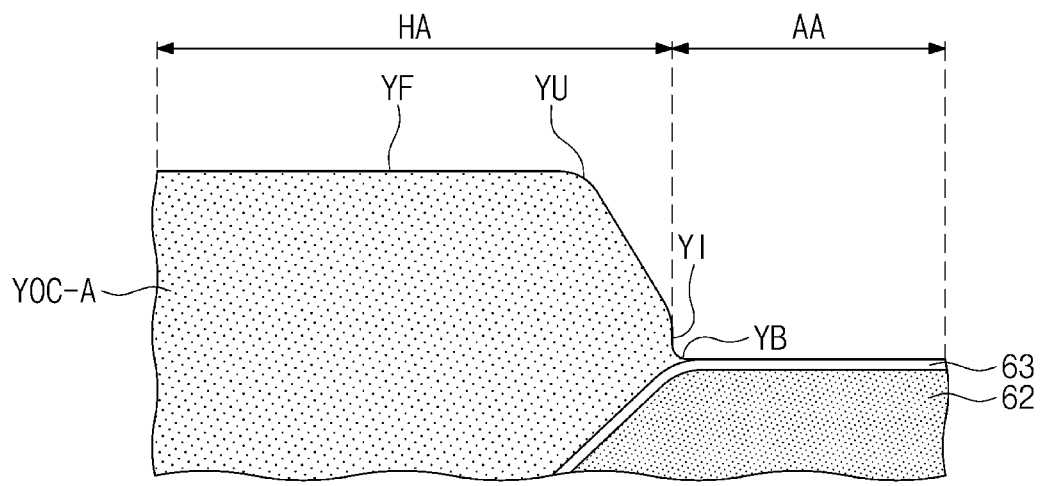
FIGS. 12A, 12B, 12C, 12D, 12E, 12F, 12G, 12H, and 12I are views showing a method of manufacturing an electronic panel according to an exemplary embodiment.

Referring to FIG. 12A, the manufacturing method of the electronic panel includes providing a preliminary electronic panel.

The preliminary electronic panel may be provided in a state, in which a preliminary planarization portion YOC-A is formed in the hole area HA of the display unit 210 among the components described with reference to FIG. 4C. The preliminary planarization portion YOC-A may make contact with a portion of the second inorganic layer 63 formed on the organic layer 62 of the encapsulation layer 60 (refer to FIG. 4C).

A portion at which a flat surface YF and an inclined surface YI of the preliminary planarization portion YOC-A make contact with each other may be referred to as an "upper end YU", and an edge of the inclined surface YI, which makes contact with the second inorganic layer 63, may be referred to as a "lower end YB". An edge of the hole area HA may correspond to a boundary at which the lower end YB of the planarization portion YOC-A makes contact with the encapsulation layer 60 (refer to FIG. 4C).

Figure 12B:
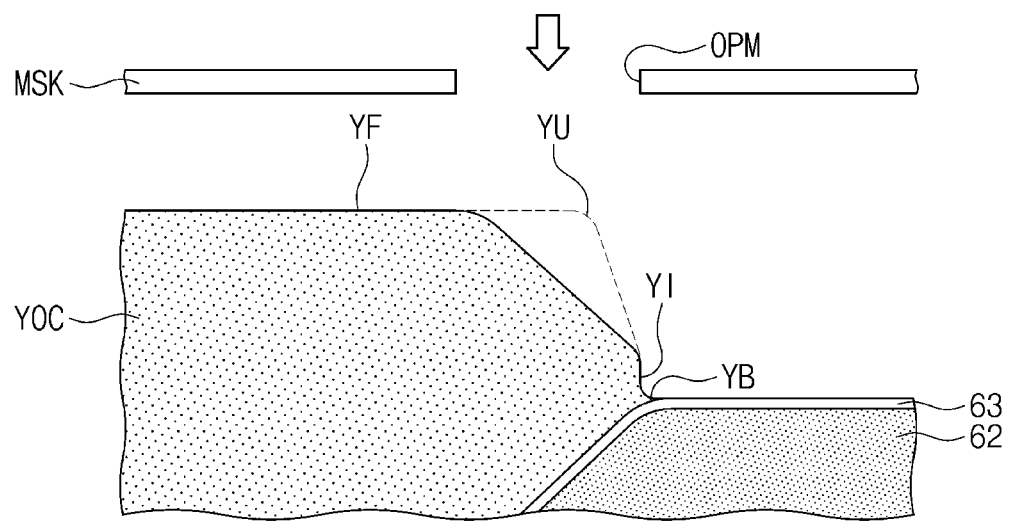
Figure 12C:
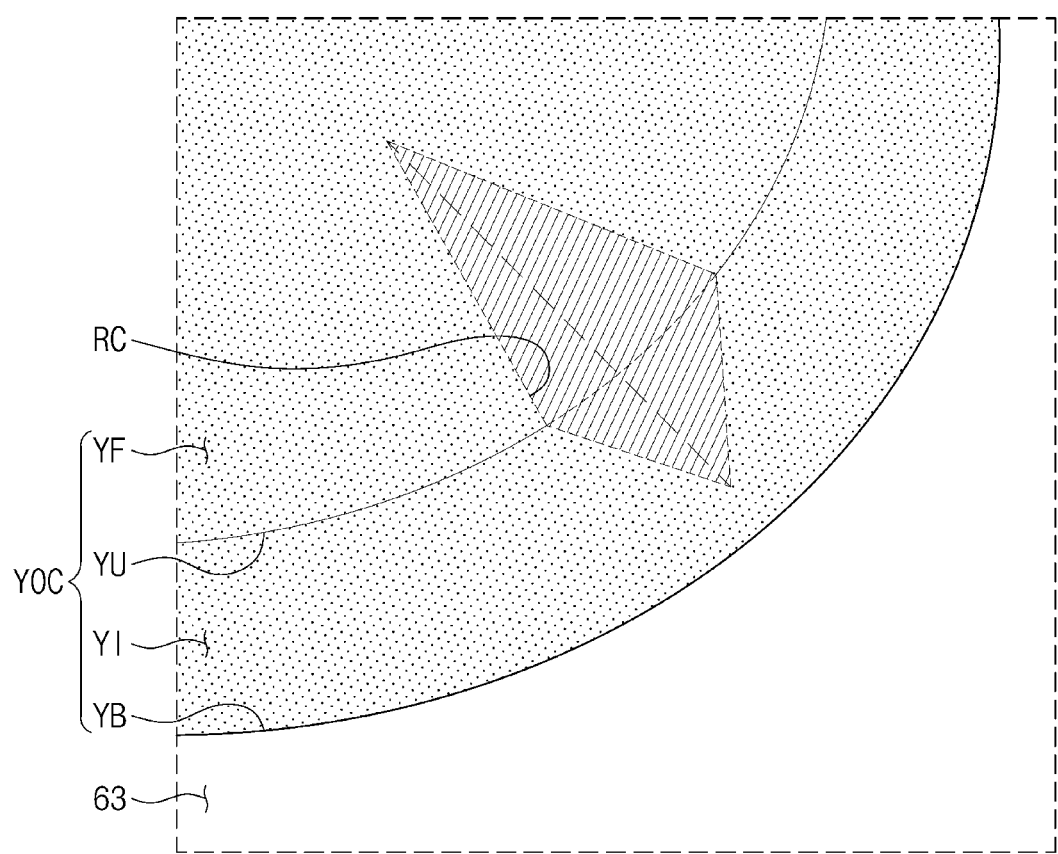

Referring to FIGS. 12B and 12C, the manufacturing method of the electronic panel includes forming a recess portion.

The recess portion RC may be formed by removing a portion of the preliminary planarization portion YOC-A using a mask MSK, through which an opening OPM is defined. The preliminary planarization portion YOC-A, in which the recess portion RC is formed, is referred to as the "planarization portion" YOC.

The recess portion RC may be formed to be recessed from the flat surface YF and the inclined surface YI in thickness and width directions. In the present illustrated embodiment, the recess portion may have substantially a triangular pyramid shape, without being limited thereto.

The recess portion RC may have the shape, whose width and thickness increase from the hole area HA to the active area AA. In addition, the inclination of the lower end of the recess portion RC may be gentle as compared with the inclination of the inclined surface YI when viewed in a cross section.

Figure 12D:
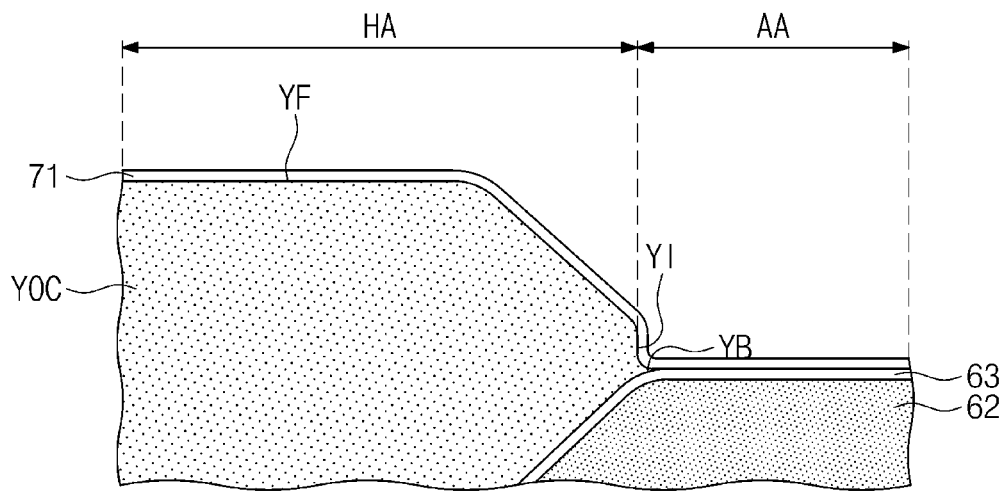
Figure 12E:
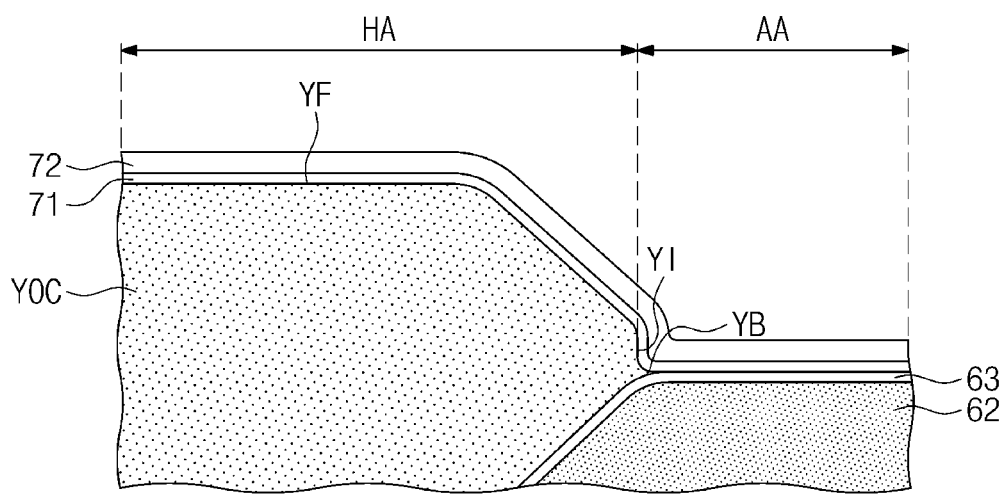

Referring to FIGS. 12D and 12E, the manufacturing method of the electronic panel includes forming inorganic layers.

The sensing insulating layers 71 and 72 may be deposited over the entire surface of the hole area HA and the active area AA. Portions of the sensing insulating layers 71 and 72, which overlap with the recess portion RC, may be formed on the recess portion RC to correspond to the shape of the recess portion RC. The sensing insulating layers 71 and 72 may be formed through a chemical vapor deposition process.

Figure 12F:
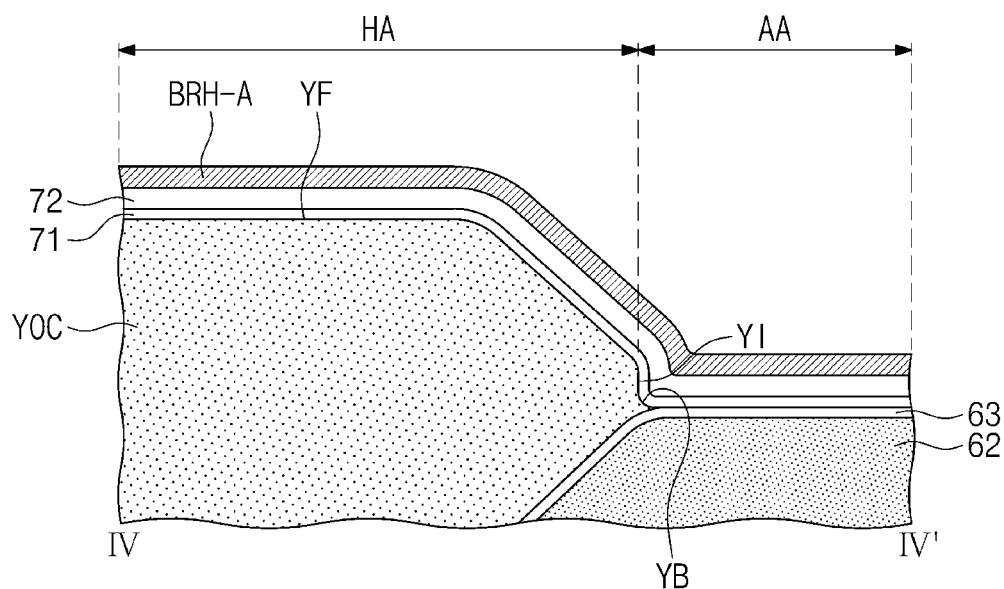

Referring to FIG. 12F, the manufacturing method of the electronic panel includes forming a preliminary conductive layer. The preliminary conductive layer BRH-A may be formed to cover an entire surface of the second sensing insulating layer 72. The preliminary conductive layer BRH-A may include a conductive material. The portion of the preliminary conductive layer BRH-A, which overlaps with the recess portion RC, may be formed to correspond to the shape of the recess portion RC by taking into account a thickness of the sensing insulating layers 71 and 72 overlapping with the recess portion RC.

Figure 12G:
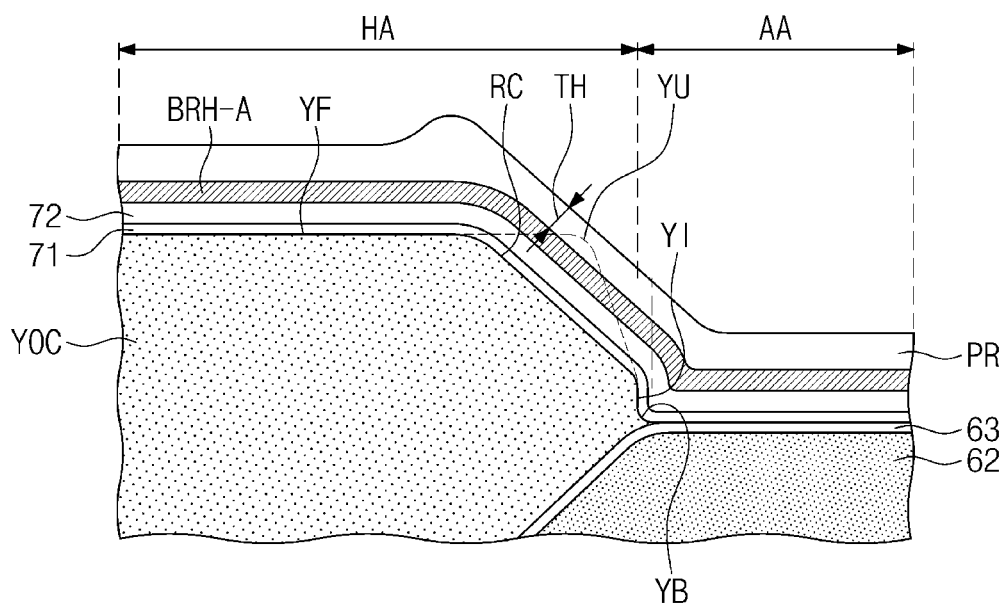

Then, referring to FIG. 12G, the manufacturing method of the electronic panel includes forming a photoresist layer.

The photoresist layer PR may be formed to cover an entire surface of the preliminary conductive layer BRH-A. The photoresist layer PR may be used as a mask layer for a material that is to be patterned during a photolithography process.

A portion of the photoresist layer PR, which overlaps with the recess portion RC, may be formed at a gentle inclination as compared with the inclined surface YI on the preliminary conductive layer BRH-A. In FIG. 12G, the planarization portion YOC adjacent to the recess portion RC is indicated by a dotted line when viewed in a cross-section.

Due to a predetermined inclination angle of the flat surface YF and the inclined surface YI, the photoresist layer PR may be coated with a relatively small thickness in an area adjacent to the upper end YU. Accordingly, the preliminary conductive layer BRH-A formed under the photoresist layer PR with the relatively small thickness may be removed with the photoresist layer PR after exposure and development processes, and thus, may be disconnected from adjacent preliminary conductive layer BRH-A.

According to an exemplary embodiment, the photoresist layer PR disposed on the recess portion RC may have a gentle inclination as compared with the photoresist layer PR disposed on the inclined surface YI, and may be coated with a uniform thickness TH without being disconnected in the area adjacent to the upper end YU. In addition, the thickness of the photoresist layer PR may be maximized in an area where a width of the recess portion RC is small on the plane.

Figure 12H:
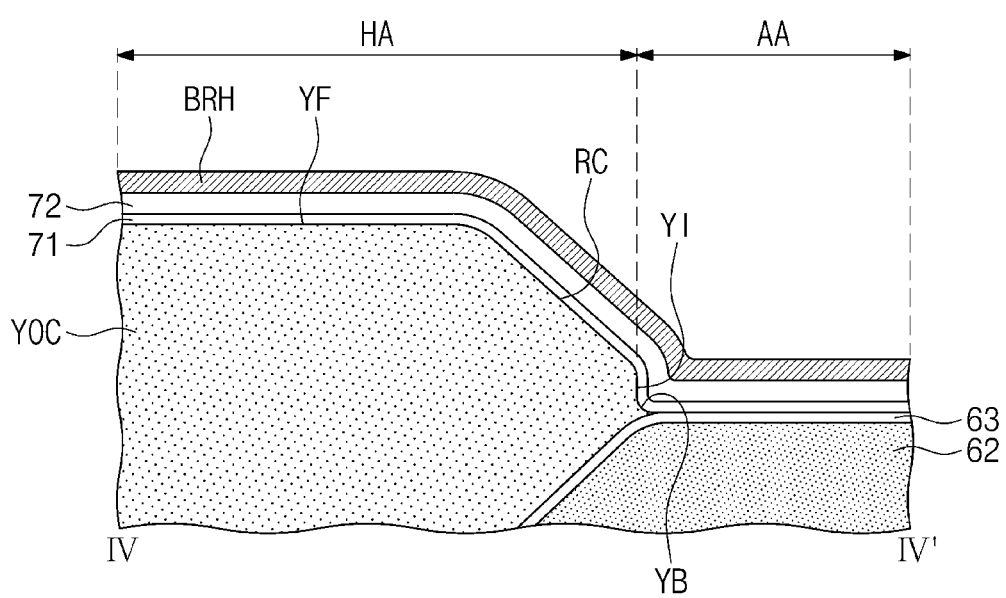
Figure 12I:
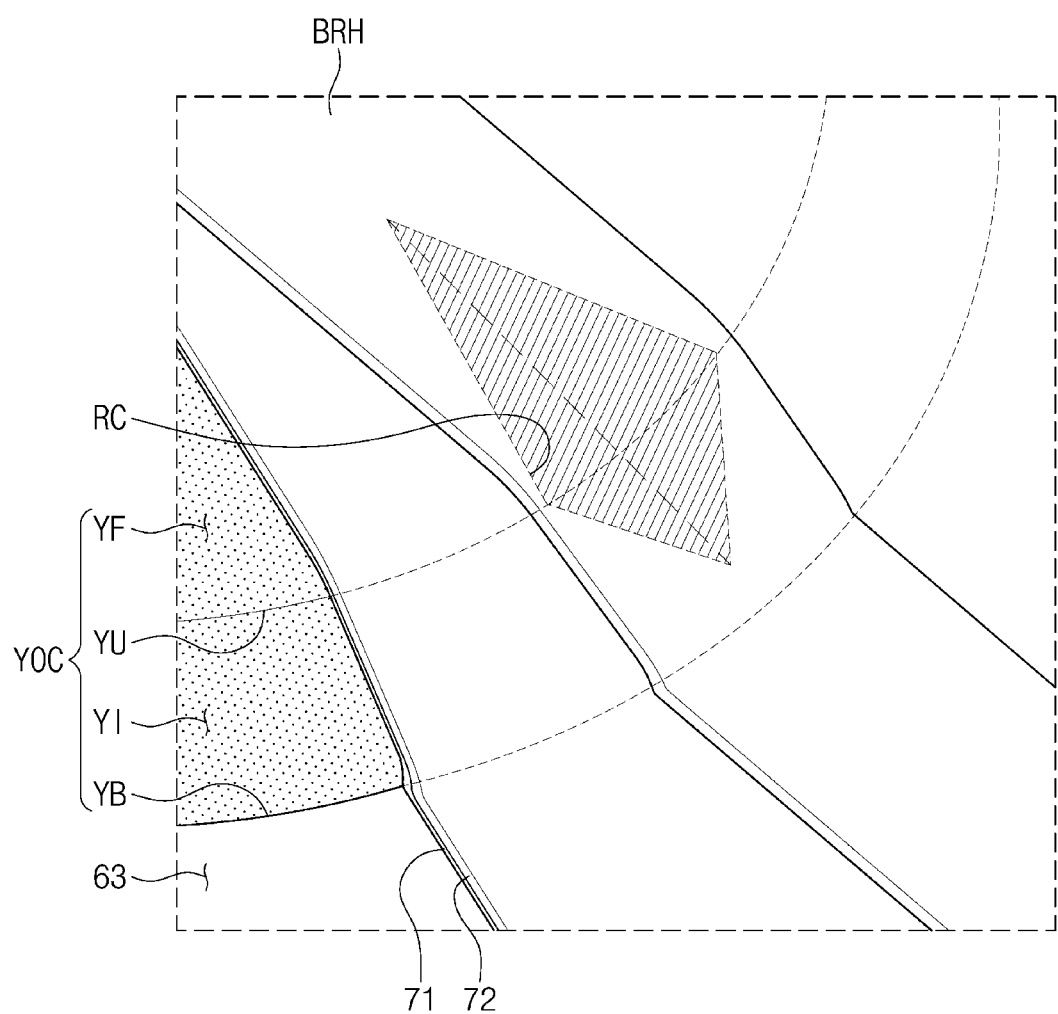

Then, referring to FIGS. 12H and 12I, the manufacturing method of the electronic panel includes forming the connection line.

The connection line BRH may be formed by patterning the preliminary conductive layer BRH-A using the photoresist layer PR as a mask. The connection line BRH may extend in the direction to the active area AA from the hole area HA. Therefore, the connection line BRH may cross the flat surface YF and the inclined surface YI.

According to an exemplary embodiment, the connection line BRH is formed to overlap with the recess portion RC. Since the photoresist layer PR is coated with the uniform thickness TH in the area overlapping with the recess portion RC, the connection line BRH may extend to the active area AA without being disconnected on the planarization portion YOC. Thus, the electrical characteristics of the electronic panel may be improved.

According to the exemplary embodiments, since the crack sensing portion is formed in the electronic panel, it is possible to easily determine whether a crack has occurred in the electronic panel. In addition, as the recess portion is defined in the organic layer disposed under the crack sensing portion, the disconnection of the crack sensing portion that may be caused by the step difference on the organic layer may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic panel comprising:
   a base substrate;
   a display unit disposed on the base substrate and comprising a plurality of pixels and an encapsulation layer covering the pixels;
   a sensing unit disposed on the display unit and comprising a sensing insulating layer, a first conductive pattern, and a second conductive pattern, the first and second conductive patterns being disposed on different layers from each other with the sensing insulating layer interposed therebetween;
   a planarization portion disposed between the display unit and the sensing unit, and comprising a flat surface, an inclined surface inclined at a predetermined inclination angle from the flat surface, and a recess portion recessed from the flat surface and the inclined surface; and
   a crack sensing portion disposed on the sensing insulating layer, spaced apart from the first and second conductive patterns, and comprising:
      a crack sensing pattern overlapping with the planarization portion;
      a first connection line connected to one end of the crack sensing pattern and extending in a first direction; and
      a second connection line connected to the other end of the crack sensing pattern, spaced apart from the first connection line, and extending in the first direction,
   wherein at least one of the first connection line and the second connection line overlaps with the recess portion.

2. The electronic panel of claim 1, wherein a thickness of the recess portion measured from an imaginary surface extending from the flat surface increases along the first direction.

3. The electronic panel of claim 1, wherein a width of the recess portion in a direction perpendicular to the first direction increases in a direction toward an upper end, at which the flat surface contacts the inclined surface.

4. The electronic panel of claim 3, wherein the recess portion has a polygonal shape when viewed in a plan view.

5. The electronic panel of claim 3, wherein the recess portion has a semicircular shape in an area overlapping with the inclined surface when viewed in a plan view.

6. The electronic panel of claim 1, wherein the inclination angle is equal to or less than about 90 degrees.

7. The electronic panel of claim 1, wherein at least a portion of the planarization portion contacts the encapsulation layer.

8. The electronic panel of claim 7, further comprising a module hole defined through the display unit, the sensing unit, and the planarization portion,
   wherein the planarization portion surrounds an edge of the module hole.

9. The electronic panel of claim 8, wherein the crack sensing pattern has an open-curve shape that surrounds at least a portion of the module hole.

10. The electronic panel of claim 8, wherein the base substrate further comprises a groove recessed from a portion of an upper surface of the base substrate and having a closed-line shape.

11. The electronic panel of claim 1, wherein at least one of the first connection line and the second connection line is covered by the sensing insulating layer.

12. The electronic panel of claim 11, wherein at least one of the first and second connection lines covered by the sensing insulating layer is connected to the crack sensing pattern via a contact hole defined through the sensing insulating layer.

13. The electronic panel of claim 1, wherein the sensing unit comprises:
   a first sensing electrode comprising a first sensing pattern, and a first connection pattern disposed on a different layer from the first sensing pattern and connected to the first sensing pattern after penetrating through the sensing insulating layer;
   a second sensing electrode comprising a second sensing pattern disposed on the same layer as the first sensing pattern while being spaced apart therefrom, and a second connection pattern connected to the second sensing pattern; and
   a dummy pattern portion comprising floating patterns disposed on the same layer as the first sensing pattern, spaced apart from the first sensing pattern and the second sensing pattern, and connected to each of the first connection line and the second connection line, and
   wherein the first conductive pattern comprises the first connection pattern, and the second conductive pattern comprises the first sensing pattern, the second sensing pattern, the second connection pattern, and the dummy pattern portion.

14. The electronic panel of claim 13, wherein:
   the crack sensing portion comprises crack sensing lines disposed on the sensing insulating layer and spaced apart from the first sensing electrode and the second sensing electrode; and
   each of the floating patterns is connected to a corresponding crack sensing line among the crack sensing lines.

15. An electronic apparatus comprising:
   an electronic panel having a front surface and a rear surface facing the front surface, and comprising a module hole defined through the front surface and the rear surface; and
   an electronic module overlapping with the module hole, the electronic panel comprising:
      a base substrate having an active area and a peripheral area adjacent to the active area, the active area including a hole area overlapping with the module hole;
   a display unit disposed on the base substrate and comprising a plurality of pixels arranged in the active area and an encapsulation layer covering the pixels;
   a sensing unit disposed on the display unit and comprising a sensing insulating layer, a first conductive pattern, and a second conductive pattern, the first and second conductive patterns being disposed on different layers from each other with the sensing insulating layer interposed therebetween;

a planarization portion disposed in the hole area between the display unit and the sensing unit, and comprising a flat surface, an inclined surface inclined at a predetermined inclination angle from the flat surface, and a recess portion recessed from the flat surface and the inclined surface; and a crack sensing portion comprising:
- a crack sensing pattern disposed in the hole area to surround at least a portion of the module hole and overlapping with the planarization portion;
- a first connection line connected to one end of the crack sensing pattern and overlapping with the hole area and a portion of the active area; and
- a second connection line connected to the other end of the crack sensing pattern, spaced apart from the first connection line, and overlapping with the hole area and a portion of the active area, wherein at least one of the first connection line and the second connection line overlaps with the recess portion.

16. The electronic apparatus of claim 15, wherein a thickness of the recess portion measured from an imaginary surface extending from the flat surface increases along a first direction to which the first connection line extends.

17. The electronic apparatus of claim 15, wherein a width of the recess portion in a second direction perpendicular to first direction increases along the first direction.

18. The electronic apparatus of claim 15, wherein the recess portion has a polygonal shape when viewed in a plan view.

19. The electronic apparatus of claim 18, wherein a portion of the recess portion overlapping with the inclined surface has a V-shape or a U-shape when viewed in a plan view.

20. The electronic apparatus of claim 15, wherein:
the crack sensing pattern has an open-curve shape; and
the module hole is defined inside the open-curve of the crack sensing pattern to penetrate through each of the display unit, the sensing unit, and the planarization portion.

* * * * *